(12) United States Patent
Umezawa

(10) Patent No.: US 7,376,023 B2
(45) Date of Patent: May 20, 2008

(54) SEMICONDUCTOR MEMORY DEVICE WITH MOS TRANSISTORS EACH HAVING FLOATING GATE AND CONTROL GATE AND METHOD OF CONTROLLING THE SAME

(75) Inventor: Akira Umezawa, Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 128 days.

(21) Appl. No.: 11/471,681

(22) Filed: Jun. 21, 2006

(65) Prior Publication Data

US 2007/0109876 A1 May 17, 2007

(30) Foreign Application Priority Data

Nov. 11, 2005 (JP) ............................. 2005-327582

(51) Int. Cl.
*G11C 7/00* (2006.01)
(52) U.S. Cl. ............................. 365/189.09; 365/189.07
(58) Field of Classification Search ........... 365/189.09, 365/189.07, 226; 327/536, 537; 523/313, 523/315
See application file for complete search history.

(56) References Cited

U.S. PATENT DOCUMENTS 5,369,354 A * 11/1994 Mori .......................... 323/313

6,219,293 B1 * 4/2001 Butler et al. ................. 365/226
6,535,435 B2 * 3/2003 Tanaka et al. .......... 365/189.09

OTHER PUBLICATIONS

Shigeru Atsumi, et al., "A Channel-Erasing 1.8-V-Only 32-Mb NOR Flash EEPROM with a Bitline Direct Sensing Scheme", IEEE Journal of Solid-State Circuits, vol. 35, No. 11, Nov. 2000, pp. 1648-1654.
Wei-Hua Liu, et al., "A 2-Transistor Source-select (2TS) Flash EEPROM for 1.8V-Only Applications", NVSMW 4.1, Feb. 1997, pp. 1-3.

* cited by examiner

*Primary Examiner*—Vu A. Le
(74) *Attorney, Agent, or Firm*—Oblon, Spivak, McClelland, Maier & Neustadt, P.C.

(57) ABSTRACT

A semiconductor memory device includes memory cells, a memory cell array, a first voltage generating circuit, a reference voltage generating circuit, and a first voltage control circuit. Each of the memory cells includes a first MOS transistor comprising a floating gate and a control gate formed on the floating gate. The memory cell array includes the memory cells arranged in a matrix. The first voltage generating circuit generates a first positive voltage. The reference voltage generating circuit generates a first reference voltage. The first voltage control circuit sets the first positive voltage at a voltage value based on the first reference voltage and outputs a resulting second positive voltage. An output impedance of the first voltage control circuit varies depending on the number of bits into which data is simultaneously written. The second positive voltage is used to write and erase data into and from the memory cells.

19 Claims, 25 Drawing Sheets

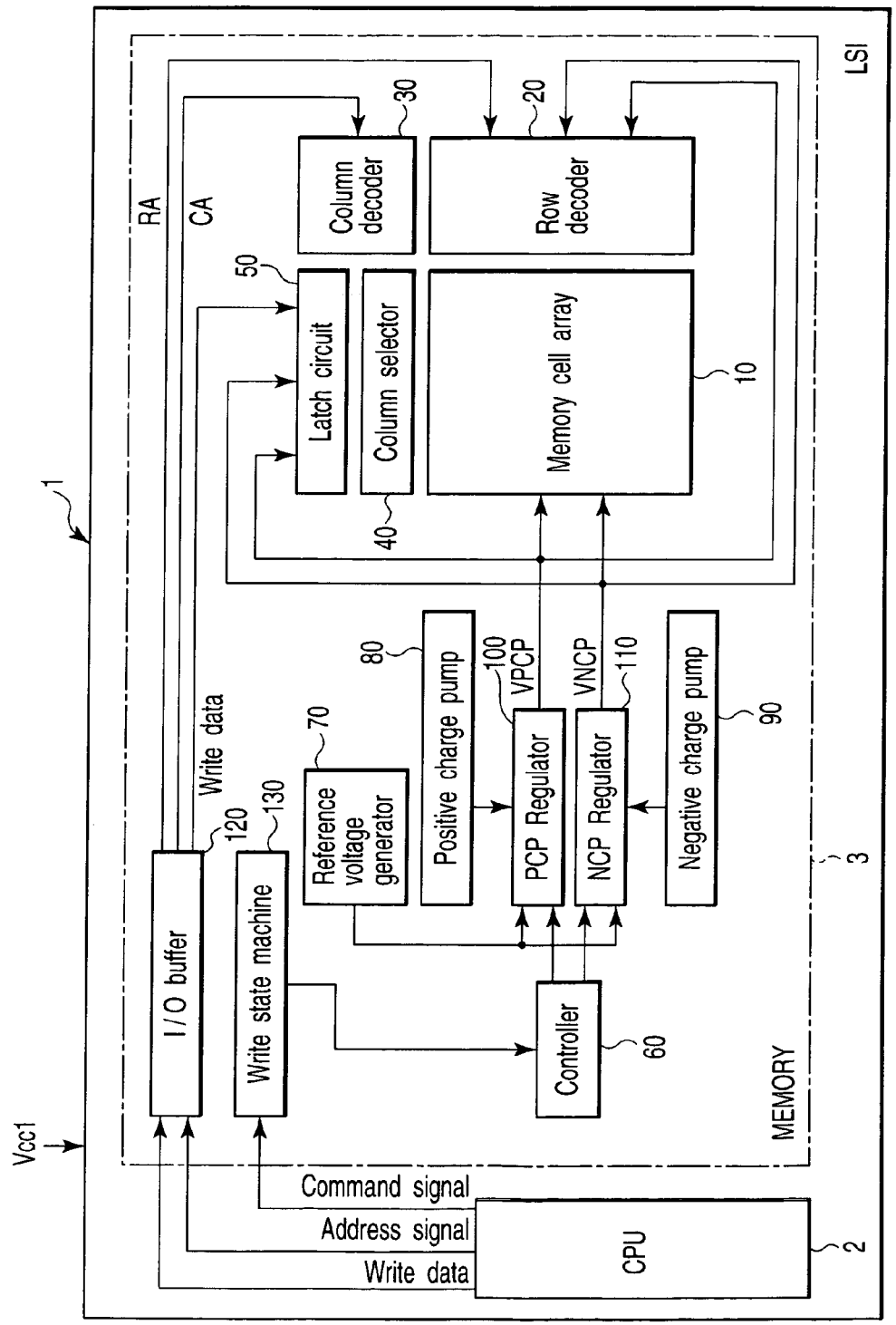
F I G. 1

Reference voltage generator

Positive charge pump

Negative charge pump

PCP Regulator

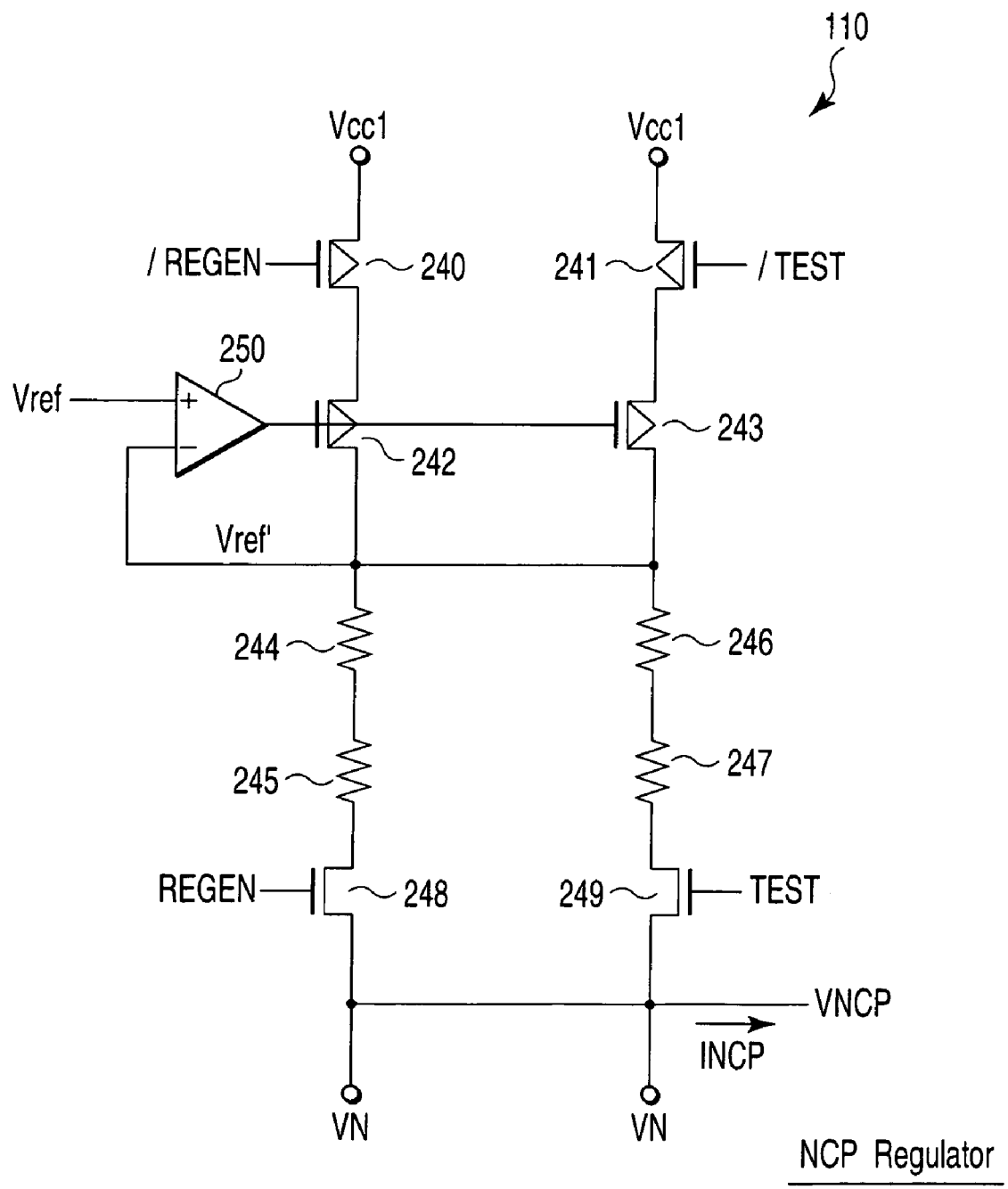
F I G. 8

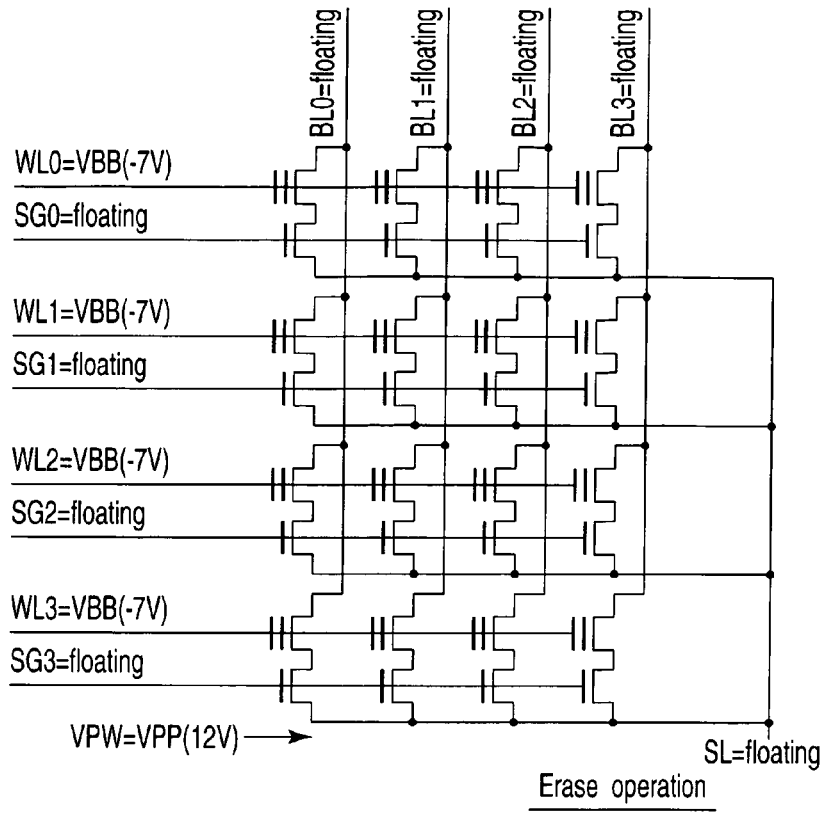
FIG. 10  Erase operation
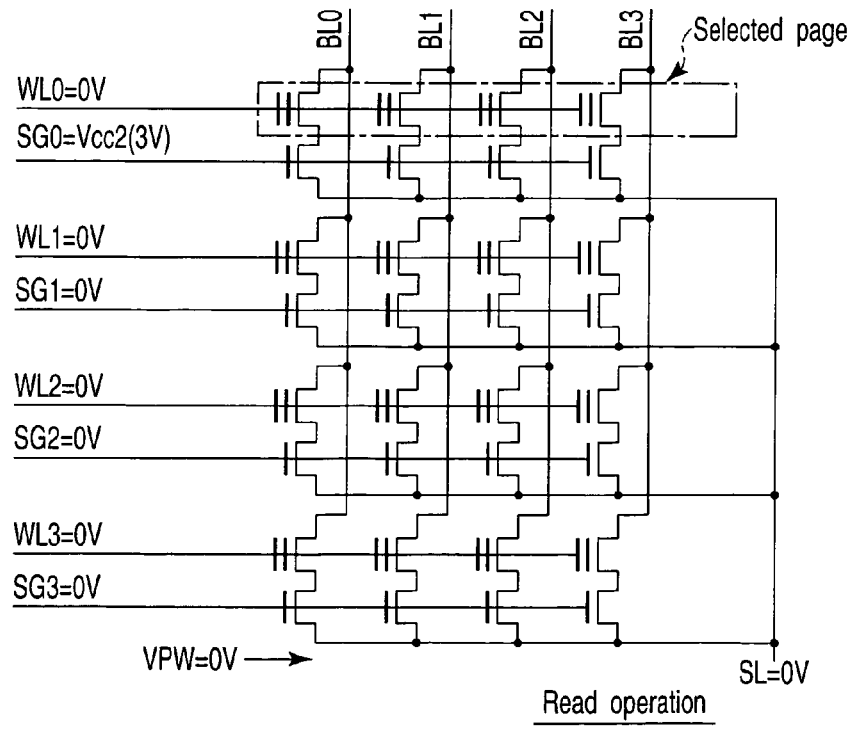
FIG. 11  Read operation

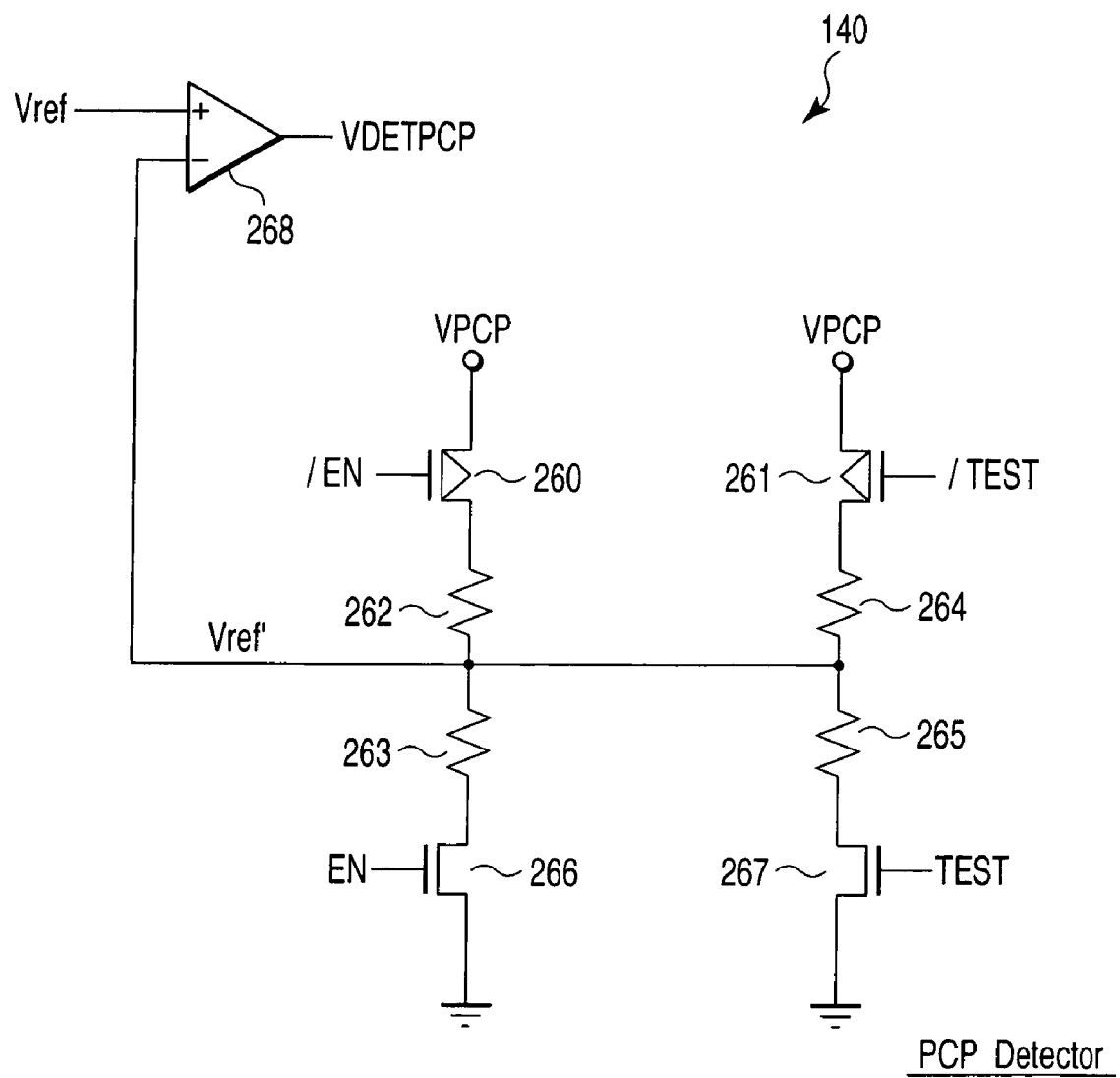
F I G. 21

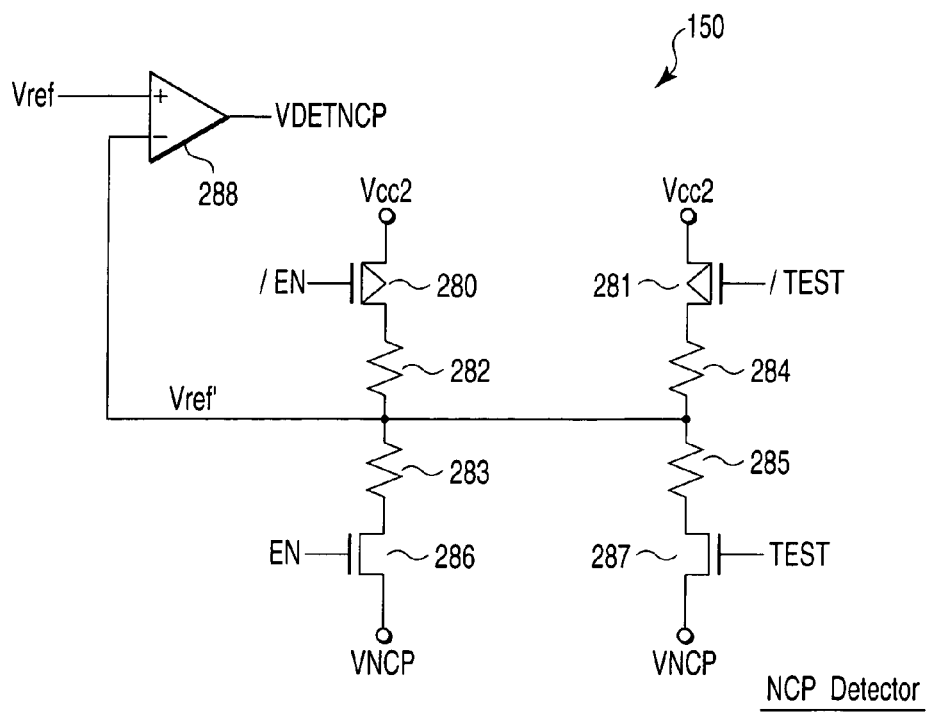
F I G. 2 2
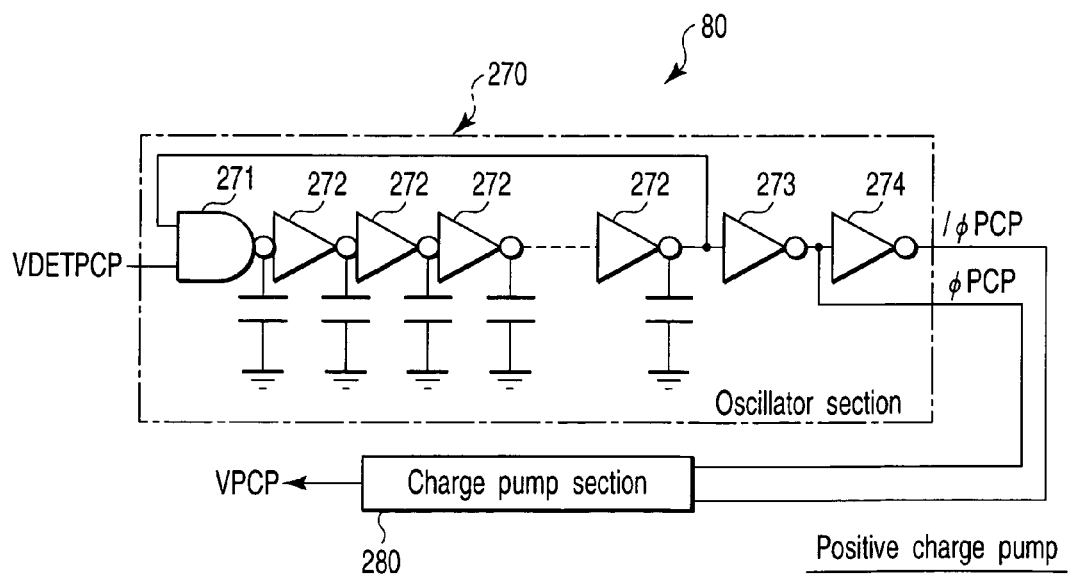
F I G. 2 3

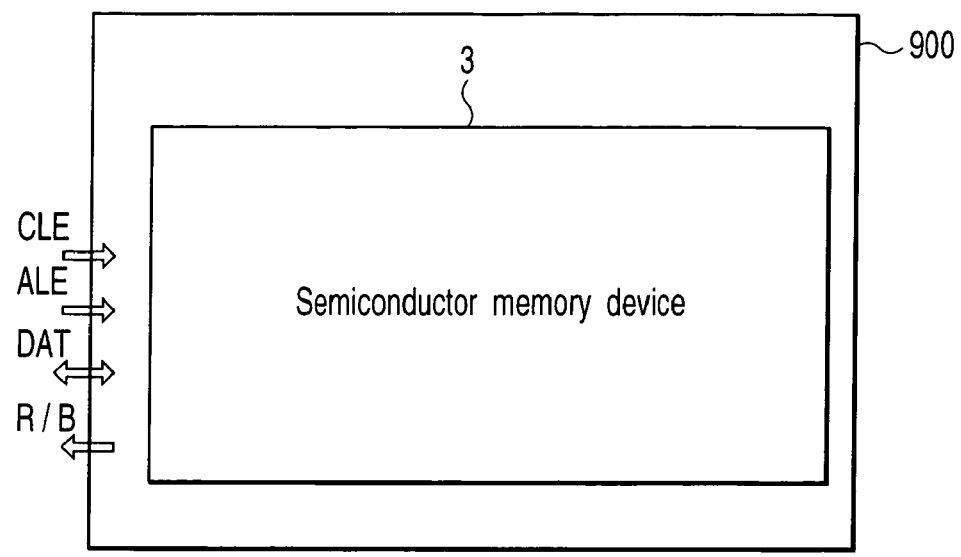
F I G. 3 0
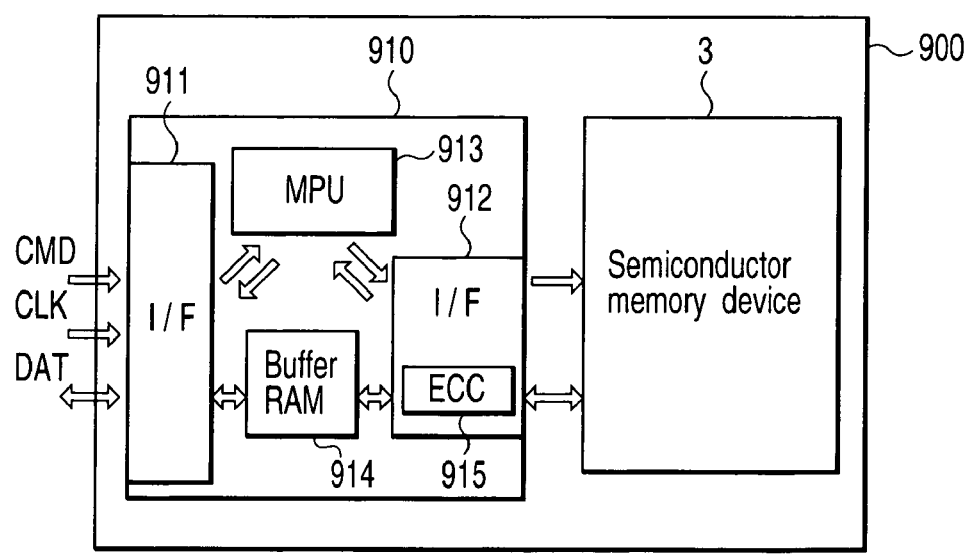
F I G. 3 1

SEMICONDUCTOR MEMORY DEVICE WITH MOS TRANSISTORS EACH HAVING FLOATING GATE AND CONTROL GATE AND METHOD OF CONTROLLING THE SAME

CROSS-REFERENCE TO RELATED APPLICATIONS

This application is based upon and claims the benefit of priority from prior Japanese Patent Application No. 2005-327582, filed Nov. 11, 2005, the entire contents of which are incorporated herein by reference.

BACKGROUND OF THE INVENTION

1. Field of the Invention

This invention relates to a semiconductor memory device and a control method for the semiconductor memory device. More particularly, this invention relates to a nonvolatile semiconductor memory device including MOS transistors, each having a floating gate and a control gate.

2. Description of the Related Art

NOR and NAND flash memories have been widely used as nonvolatile semiconductor memories.

In recent years, a flash memory combining the features of both the NOR and the NAND flash memory has been proposed in, for example, Wei-Hua Liu, "A 2-Transistor Source-select (2TS) Flash EEPROM for 1.8-V-Only Application," Non-Volatile Semiconductor Memory Workshop 4.1, 1997. A flash memory of this type has memory cells, each including two MOS transistors (hereinafter, referred to as a 2Tr flash memory).

In the flash memory, to write or erase data, a voltage higher than one from an external power supply is applied to between a word line and a semiconductor substrate (or a drain of a memory cell). Once the data write or erase operation is completed, the potential of a control gate and the semiconductor substrate are reset to, for example, 0V (this is called a reset operation).

However, in the conventional flash memory, a parasitic capacitance is present between the control gate and the semiconductor substrate. Consequently, coupling caused by the parasitic capacitance disadvantageously makes it difficult to perform a quick reset operation.

BRIEF SUMMARY OF THE INVENTION

A semiconductor memory device according to an aspect of the present invention includes:

a plurality of memory cells each including a first MOS transistor comprising a floating gate and a control gate formed on the floating gate;

a memory cell array comprising a plurality of the memory cells arranged in a matrix;

a first voltage generating circuit which generates a first positive voltage;

a reference voltage generating circuit which generates a first reference voltage; and a first voltage control circuit which sets the first positive voltage generated by the first voltage generating circuit at a voltage value based on the first reference voltage and which outputs a resulting second positive voltage, an output impedance of the first voltage control circuit varying depending on the number of bits into which data is simultaneously written, the second positive voltage being used to write and erase data into and from the memory cells.

A method of controlling a semiconductor memory device according to an aspect of the present invention includes:

writing data into memory cells connected to a plurality of word lines simultaneously, using a positive voltage and a negative voltage;

after writing the data, reducing an output impedance of a first voltage generating circuit which generates the positive voltage;

with the output impedance of the first voltage generating circuit reduced, setting a node to which the negative voltage has been applied at a first read potential used to read the data; and after the node is set at the first read potential, setting a node to which the positive voltage has been applied at a second read potential used to read the data.

A memory card according to an aspect of the present invention includes a semiconductor memory device, the device comprising:

a plurality of memory cells each including a first MOS transistor comprising a floating gate and a control gate formed on the floating gate;

a memory cell array comprising a plurality of the memory cells arranged in a matrix;

a first voltage generating circuit which generates a first positive voltage;

a reference voltage generating circuit which generates a first reference voltage; and a first voltage control circuit which sets the first positive voltage generated by the first voltage generating circuit at a voltage value based on the first reference voltage and which outputs a resulting second positive voltage, an output impedance of the first voltage control circuit varying depending on the number of bits into which data is simultaneously written, the second positive voltage being used to write and erase data into and from the memory cells.

BRIEF DESCRIPTION OF THE SEVERAL VIEWS OF THE DRAWING

FIG. 1 is a block diagram of LSI in accordance with a first embodiment of the present invention;

FIG. 8 is a circuit diagram of a negative voltage regulator provided in the flash memory in accordance with the first embodiment of the present invention;

FIG. 10 is a circuit diagram of the memory cell array provided in the flash memory in accordance with the first embodiment of the present invention and in which an erase operation is being performed;

FIG. 11 is a circuit diagram of the memory cell array provided in the flash memory in accordance with the first embodiment of the present invention and in which a read operation is being performed;

FIG. 21 is a circuit diagram of a positive voltage detector provided in a flash memory in accordance with the second embodiment of the present invention;

FIG. 22 is a circuit diagram of a negative voltage detector provided in the flash memory in accordance with the second embodiment of the present invention;

FIG. 23 is a circuit diagram of a positive charge pump provided in the flash memory in accordance with the second embodiment of the present invention;

FIG. 30 is a block diagram of a memory card comprising the flash memory in accordance with any of the first to fifth embodiments of the present invention;

FIG. 31 is a block diagram of a memory card comprising the flash memory in accordance with any of the first to fifth embodiments of the present invention;

DETAILED DESCRIPTION OF THE INVENTION

Figure 2:
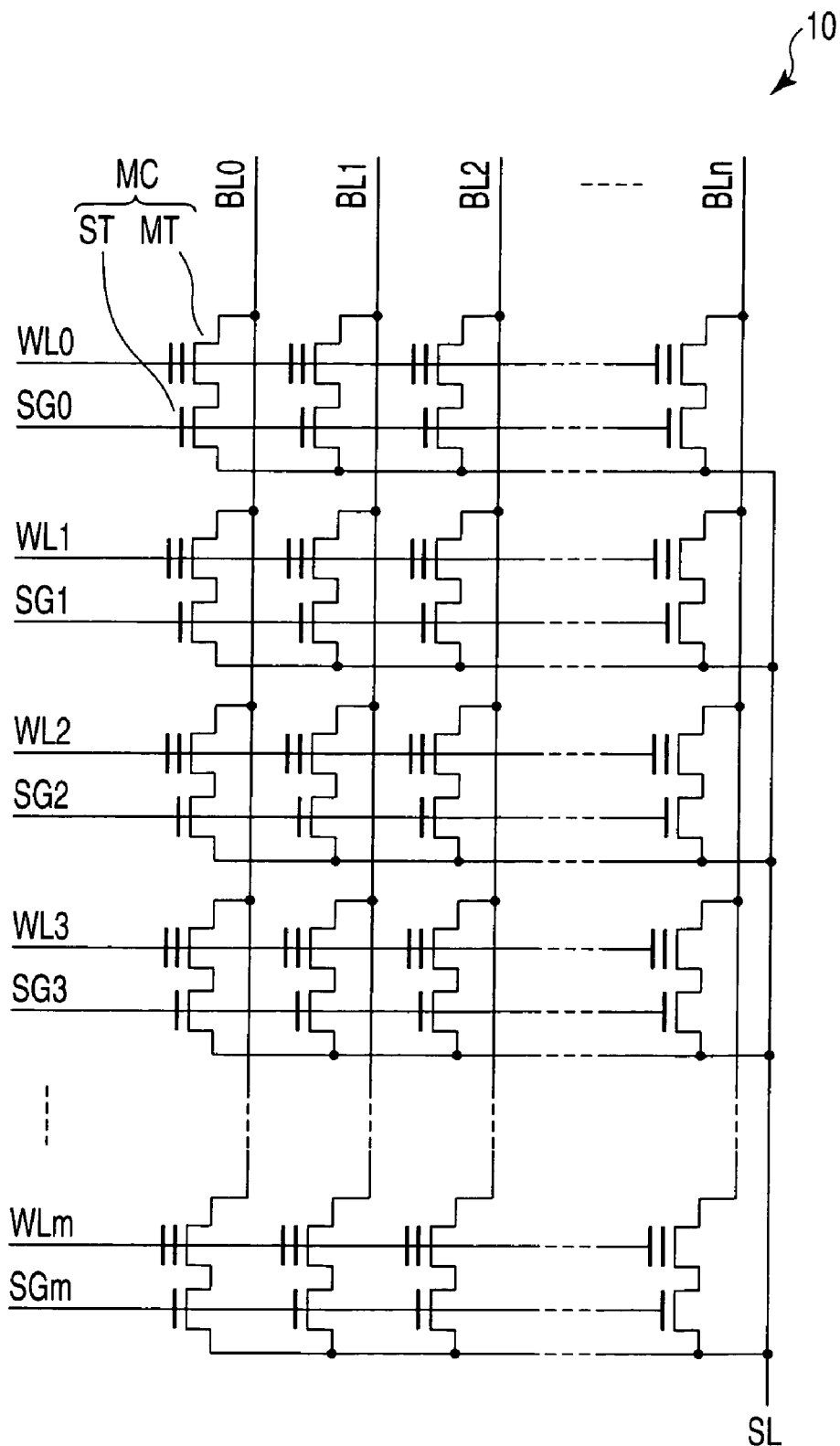
FIG. 2 is a circuit diagram of a memory cell array provided in a flash memory in accordance with the first embodiment of the present invention.

With reference to FIG. 1, description will be given of a semiconductor memory device and a method of controlling the semiconductor memory device in accordance with a first embodiment of the present invention. FIG. 1 is a block diagram of a system LSI in accordance with the present embodiment.

As shown in the figure, the system LSI 1 comprises CPU 2 and a 2Tr flash memory 3. CPU 2 transmits and receives data to and from the flash memory 3. The flash memory 3 comprises a memory cell array 10, a row decoder 20, a column decoder 30, a column selector 40, a latch circuit 50, a controller 60, a reference voltage generator 70, a positive charge pump circuit 80, a negative charge pump circuit 90, a positive voltage regulator 100, a negative voltage regulator 110, an I/O buffer 120, and a write state machine 130. The system LSI 1 is externally provided with a voltage Vcc1 (for example, 1.5V).

The memory cell array 10 has a plurality of memory cells arranged in a matrix. The configuration of the memory cell array 10 will be described with reference to FIG. 2. FIG. 2 is a circuit diagram of a partial area of the memory cell area 10.

As shown in the figure, the memory cell array 10 comprises ((m+1)×(n+1); m and n are natural numbers) memory cells MC. Each of the memory cells MC has a memory cell transistor MT and a select transistor ST having current paths connected in series. The memory cell transistor MT comprises a stacked gate structure having a floating gate formed on the semiconductor substrate with a gate insulating film interposed therebetween and a control gate formed on the floating gate with an inter-gate insulating film interposed therebetween. The separate floating gates are present for the individual memory cell transistors MT. A source region of the memory cell transistor MT is connected to a drain region of the select transistor ST.

All the control gates of the memory cell transistors MT arranged on the same row are connected to the same one of word lines WL0 to WLm. All the gates of the select transistors ST arranged on the same row are connected to the same one of select gate lines SG0 to SGm. Further, all the drains of the memory cell transistors MT arranged on the same column are connected to the same one of bit lines BL0 to BLn. All the sources of the select transistors ST are connected to a source line SL.

Figure 3:
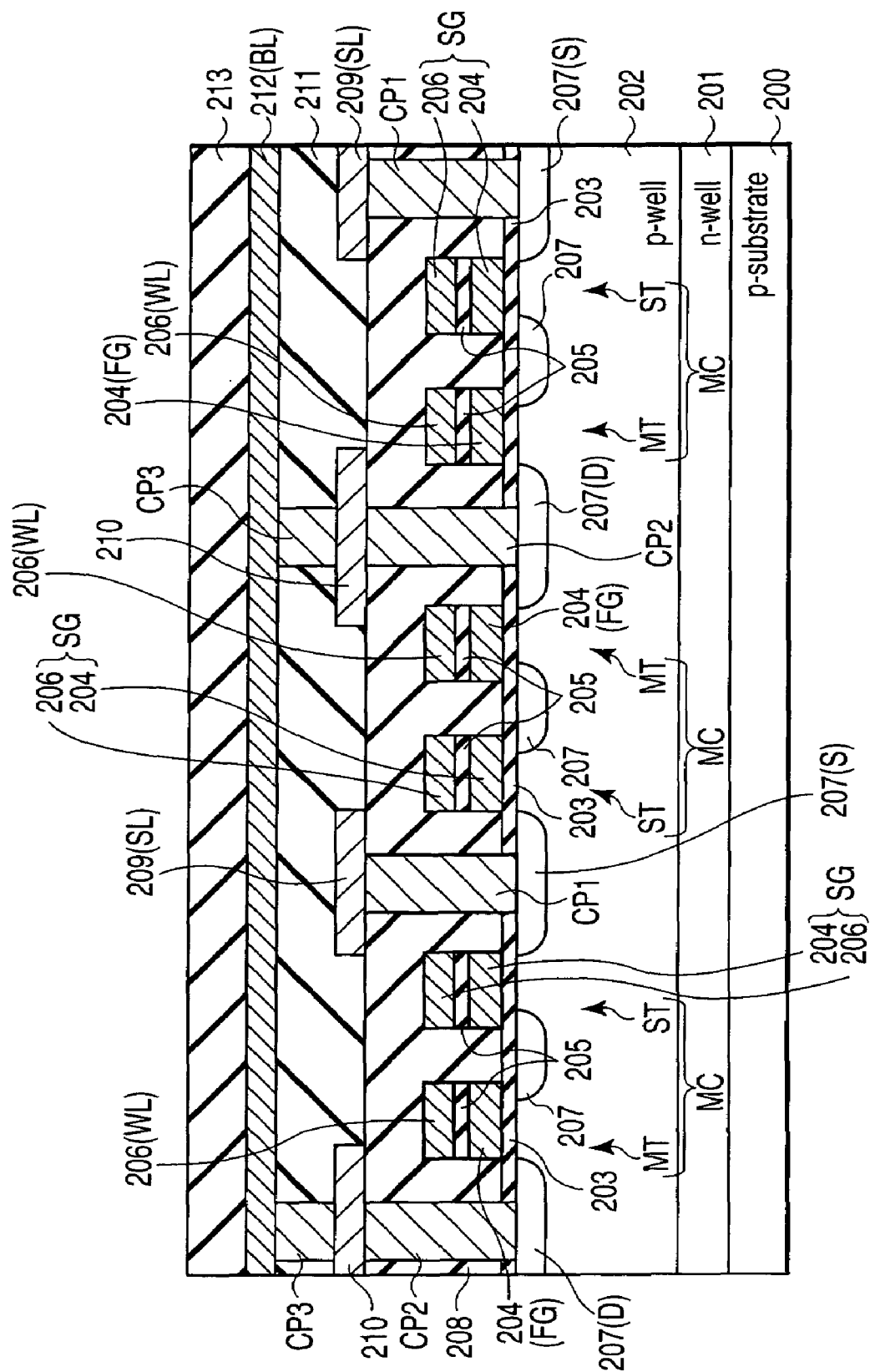
FIG. 3 is a sectional view of the memory cell array provided in the flash memory in accordance with the first embodiment of the present invention, the sectional view being taken along bit lines.

FIG. 3 is a sectional view taken along the bit lines in the memory cell array 10. As shown in the figure, an n-type well region 201 is formed in a surface region of a p-type semiconductor substrate 200. A p-type well region 202 is formed in a surface region of the n-type well region 201. A gate insulating film 203 is formed on the p-type well region 202. Gate electrodes of the memory cell transistor MT and select transistor ST are formed on the gate insulating film 203. Each of the gate electrodes of the memory cell transistor MT and select transistor ST has a polysilicon layer 204 formed on the gate insulating film, an inter-gate insulating film 205 formed on the polysilicon layer 204, and a polysilicon layer 206 formed on the inter-gate insulating film 205. The inter-gate insulating film 205 is formed of, for example, a silicon oxide film, or an ON film, NO film, or ONO film having a stacked structure of a silicon oxide film and a silicon nitride film.

In the memory cell transistor MT, the polysilicon layer 204 functions as a floating gate (FG). On the other hand, the polysilicon layers 206 arranged adjacent to one another in a direction orthogonal to the bit lines are connected together. The polysilicon layers 206 thus function control gates (or word lines WL).

In the select transistor ST, the polysilicon layers 204 and 206 arranged adjacent to one another along the word lines are connected together. The polysilicon layers 204 and 206 function as select gate lines SG. It is possible that the polysilicon layer 204 alone functions as a select gate line and not the polysilicon layer 206. In this case, the potential of the polysilicon layer 206 in the select transistor ST is at a specified value or floats.

An $n^+$-type impurity diffused layer 207 is formed in that part of a surface of the p-type well region 202 which is located between the gate electrodes. The impurity diffused layer 207 is shared by adjacent transistors. The impurity diffused layer 207 functions as a source (S) or a drain (D).

An interlayer insulating film 208 is formed on the p-type well region 202 so as to cover the memory cell transistor MT and select transistor ST. A contact plug CP1 is formed in the inter-layer insulating film 208; the contact plug CP1 reaches the impurity diffused layer (source) 207 shared by the two select transistors ST, ST. A metal wiring layer 209 connected to the contact plug CP1 is formed on the interlayer insulating film 208. The metal wiring layer 209 functions as a source line SL. Further, a contact plug CP2 is formed in the inter-layer insulating film 208; the contact plug CP2 reaches the impurity diffused layer (drain) 207 shared by the two memory cell transistors MT, MT. A metal wiring layer 210 connected to the contact plug CP2 is formed on the inter-layer insulating film 208.

An interlayer insulating film 211 is formed on the inter-layer insulating film 208 so as to cover the metal wiring layers 209 and 210. A contact plug CP3 reaching the metal wiring layer 210 is formed in the inter-layer insulating film 211. A metal wiring layer 212 connected to a plurality of the contact plugs CP3 is formed on the interlayer insulating film 211. The metal wiring layer 212 functions as a bit line BL. An interlayer insulating film 213 is formed on the interlayer insulating film 211 so as to cover the metal wiring layer 212.

Referring back to FIG. 1, further description will be given. During a write operation, the row decoder 20 selects one of the word lines WL0 to WLm on the basis of a row address signal RA. The row decoder 20 then supplies a voltage to the selected word line. Further, during a read operation, the row decoder 20 selects one of the select gate lines SG0 to SGm on the basis of a row address signal RA. The row decoder 20 then supplies a voltage to the selected select gate line. Moreover, the row decoder 20 supplies a voltage to the semiconductor substrate on which memory cells are formed.

During a read operation, the column decoder 30 and the column selector 40 selects one of the bit lines BL0 to BLn on the basis of a column address signal CA.

The latch circuit 50 latches write data.

The controller 60 controls the operations of the regulators 100 and 110.

Figure 4:
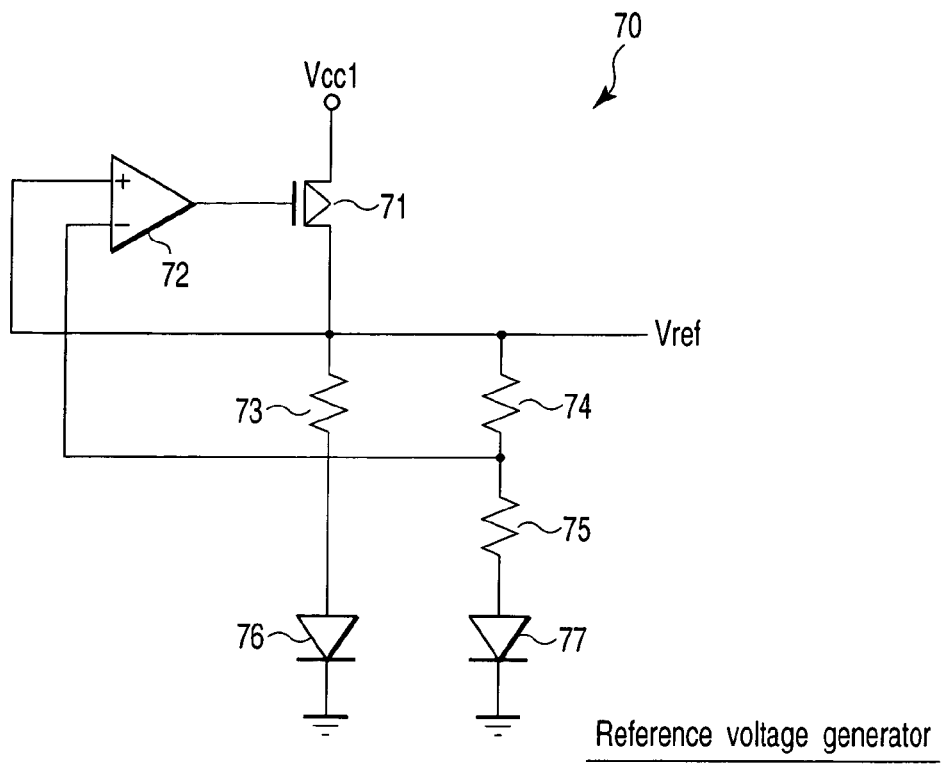
FIG. 4 is a circuit diagram of a reference voltage generator provided in the flash memory in accordance with the first embodiment of the present invention.

The reference voltage generator 70 generates and supplies a reference voltage Vref to the regulators 100 and 110. An example of the configuration of the reference voltage generator 70 will be described with reference to FIG. 4. FIG. 4 is a circuit diagram of the band gap reference type reference voltage generator 70. As shown in the figure, the reference voltage generator 70 comprises a p-channel MOS transistor 71, a comparator 72, resistance elements 73 to 75, and diodes 76 and 77. For example, a voltage Vcc1 is applied to a source of a current path in the transistor 71. The other end of the current path is connected to one end of each of the resistance elements 73 and 74. The other end of the resistance element 73 is connected to a cathode of the diode 76. An anode of the diode 76 is grounded. The other end of the resistance element 74 is connected to one end of the resistance element 75. The other end of the resistance element 75 is connected to a cathode of the diode 77. An anode of the diode 77 is grounded. The comparator 72 compares the potential of one end of the resistance element 73 with that of one end of the resistance element 75. The comparator 72 then inputs the comparison to a gate of the transistor 71. The potential of a connection node for the one end of the resistance element 73, the one end of the resistance element 74, and a source of the transistor 71 is output as the reference voltage Vref.

Figure 5:
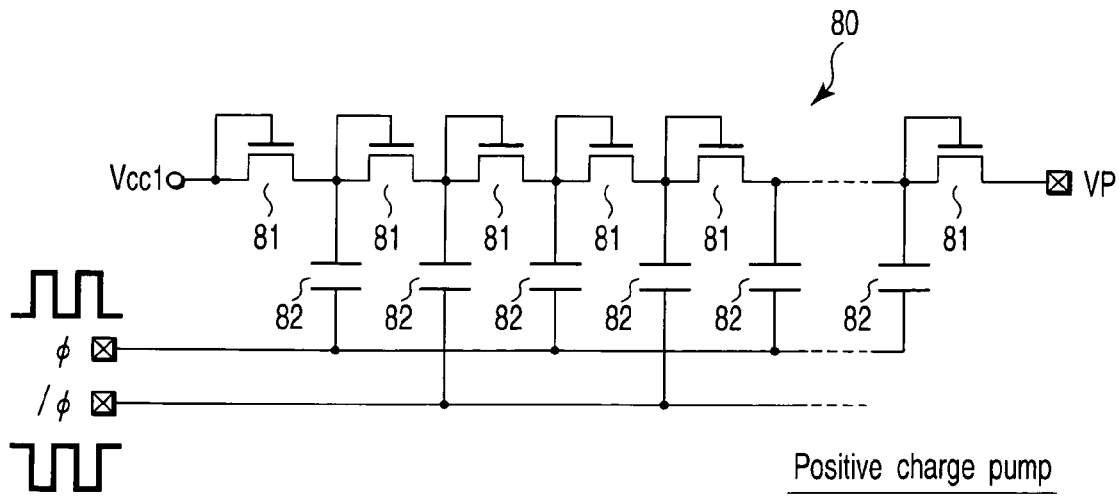
FIG. 5 is a circuit diagram of a positive charge pump provided in the flash memory in accordance with the first embodiment of the present invention.

The charge pump 80 generates a positive voltage VP higher than the external voltage Vcc1. The charge pump 90 generates a negative voltage VN lower than the external voltage Vcc1. An example of the configuration of the charge pump 80 will be described with reference to FIG. 5. FIG. 5 is a circuit diagram of the charge pump 80. As shown in the figure, the charge pump 80 comprises a plurality of n-channel MOS transistors 81 and a plurality of capacitor elements 82. Each of the MOS transistors 81 has a gate and a drain connected to each other. The MOS transistor 81 is equivalent to a diode having a drain functioning as a cathode and a source functioning as an anode. The MOS transistors 81 are connected in series so that the anode of each MOS transistor 81 is connected to the cathode of the succeeding MOS transistor 81. The voltage Vcc1 is applied to the drain of the first MOS transistor 81. A clock signal $\phi$ is input to a source of the odd-numbered MOS transistor 81 via the capacitor element 82. An inverse clock signal $/\phi$ is input to a source of the even-numbered MOS transistor 81 via the capacitor element 82. In the above configuration, the clock signals ($\phi$ and $\phi/$) are used to alternately boost the voltage across each capacitor element 82 to allow the source of the final MOS transistor 81 to output the positive voltage VP, which is higher than the external voltage Vcc1.

Figure 6:
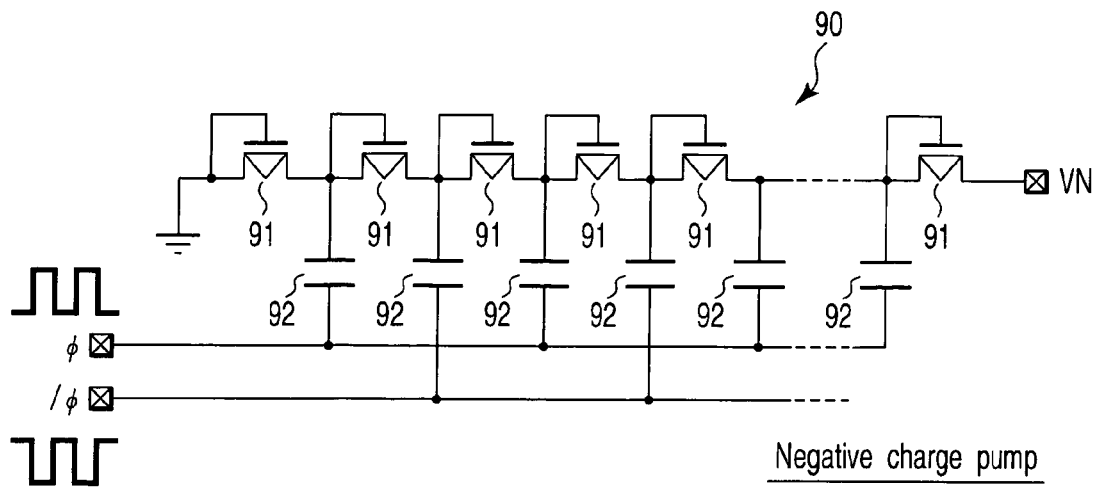
FIG. 6 is a circuit diagram of a negative charge pump provided in the flash memory in accordance with the first embodiment of the present invention.

Now, an example of the configuration of the charge pump 90 will be described with reference to FIG. 6. FIG. 6 is a circuit diagram of the charge pump 90. As shown in the figure, the configuration of the charge pump 90 is the same as that of the charge pump 80, described with reference to FIG. 5, except that the n-channel MOS transistor 81 is replaced with a p-channel MOS transistor 91. The MOS transistor 91 is equivalent to a diode having a drain functioning as an anode and a source functioning as a cathode. The present configuration allows the source of the final MOS transistor 91 to output the negative voltage VN, which is lower than the external voltage Vcc1.

The positive voltage regulator 100 controls the positive voltage VP, output by the positive charge pump 80, to a desired voltage value. The positive voltage regulator 100 thus outputs a positive voltage VPCP, which is supplied to the memory cell array 10, the row decoder 20, the latch circuit 50, and the like. The negative voltage regulator 110 controls the negative voltage VN, output by the negative charge pump 90, to a desired voltage value. The negative voltage regulator 110 thus outputs a negative voltage VNCP, which is supplied to the memory cell array 10, the row decoder 20, the latch circuit 50, and the like. Examples of configurations of the regulators 100 and 110 will be described with reference to FIGS. 7 and 8.

Figure 7:
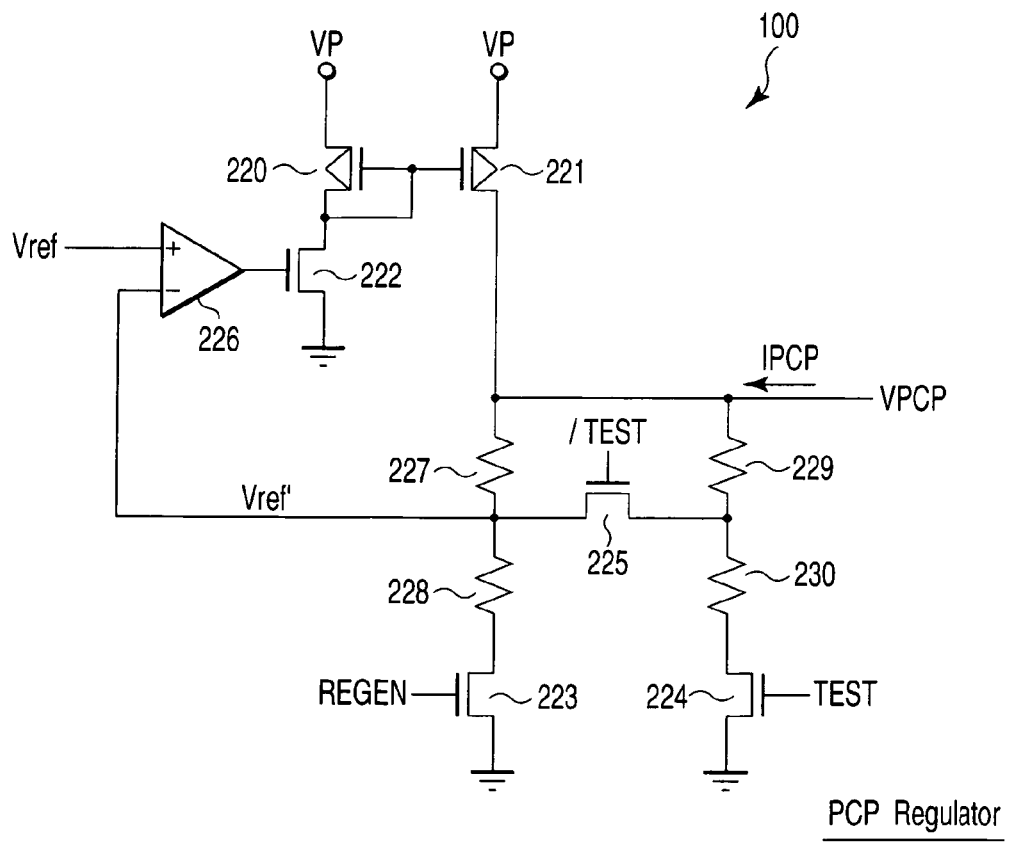
FIG. 7 is a circuit diagram of a positive voltage regulator provided in the flash memory in accordance with the first embodiment of the present invention.

First, the configuration of the regulator 100 will be described with reference to FIG. 7. FIG. 7 is a circuit diagram of the regulator 100. As shown in the figure, the regulator 100 comprises p-channel MOS transistors 220 and 221, n-channel MOS transistors 222 to 225, a comparator 226, and resistance elements 227 to 230. Gates of the MOS transistors 220 and 221 are connected together and their sources are connected to respective output nodes (that output the positive voltage VP) of the positive charge pump 80. The MOS transistors 220 and 221 thus constitute a current mirror circuit. A drain of the MOS transistor 220 is connected to the gates of the MOS transistors 220 and 221 and to a drain of the MOS transistor 222. A source of the MOS transistor 220 is grounded. A drain of the MOS transistor 221 is connected to one end of each of the resistance elements 227 and 229. The other end of the resistance element 227 is connected to one end of the resistance element 228. The other end of the resistance element 229 is connected to one end of the resistance element 230. The other end of the resistance element 228 is connected to a drain of the MOS transistor 223. A source of the MOS transistor 223 is grounded. An enable signal REGEN is input to a gate of the MOS transistor 223. The other end of the resistance element 230 is connected to a drain of the MOS transistor 224. A source of the MOS transistor 224 is grounded. A test signal TEST is input to a gate of the MOS transistor 224. Moreover, the MOS transistor 225 with an inverse test signal /TEST input to its gate is provided so that its current path (between the source and drain) is connected between the connection node between the resistance elements 227 and 228 and the connection node between the resistance elements 229 and 230. The comparator 226 compares the reference voltage Vref, generated by the reference voltage generator 70, with the voltage Vref' of the connection node between the resistance elements 227 and 228. Then, the comparator 226 inputs the comparison to the gate of the MOS transistor 222. That is, when Vref>Vref', the comparator 226 outputs an "H" level to turn on the MOS transistor 222. When Vref<', the comparator 226 performs the opposite operation. The enable signal REGEN is at the "H" level whenever the voltage generated by the charge pump 80 or 90 is supplied to the circuits. The test signal TEST is at the "H" level during a reset operation for a test on the flash memory 3. In the above configuration, an output node of the regulator 100 is the connection node between one end of each of the resistance elements 227 and 229 and the drain of the MOS transistor 221. A voltage VPCP is output from the output node of the regulator 100. A current IPCP flows through the output node of the regulator 100 and through a ground potential node (negative power supply potential node).

Now, the configuration of the regulator 110 will be described with reference to FIG. 8. FIG. 8 is a circuit diagram of the regulator 110. As shown in the figure, the regulator 110 comprises p-channel MOS transistors 240 to 243, resistance elements 244 to 237, n-channel MOS transistors 248 and 249, and a comparator 250. For example, the voltage Vcc1 is applied to a source of the MOS transistor 240. An inverse enable signal /REGEN is input to a gate of the MOS transistor 240. For example, the voltage Vcc1 is applied to a source of the MOS transistor 241. An inverse test signal /TEST is input to a gate of the MOS transistor 241. Sources of the MOS transistors 242 and 243 are connected to drains of the MOS transistors 240 and 241, respectively. Gates of the MOS transistors 242 and 243 are connected together. A drain of the MOS transistor 242 is connected to one end of the resistance element 244. A drain of the MOS transistor 243 is connected to one end of the resistance element 246. The other end of the resistance element 244 is connected to one end of the resistance element 245. The other end of the resistance element 246 is connected to one end of the resistance element 247. The other ends of the resistance elements 245 and 247 are connected to drains of the MOS transistors 248 and 249, respectively. The enable signal REGEN and the test signal TEST are input to gates of the MOS transistors 248 and 249, respectively. Sources of the MOS transistors 248 and 249 are connected to respective output nodes (that output the negative voltage VN) of the negative charge pump 90. The comparator 250 compares the reference voltage Vref, generated by the reference voltage generator 70, with the voltage Vref' of one end of each of the resistance elements 244 and 246. Then, the comparator 250 inputs the comparison to the gates of the MOS transistors 242 and 243. That is, when Vref'>Vref, the comparator 250 outputs an "L" level to turn on the MOS transistors 242 and 243. When Vref'<Vref, the comparator 226 performs the opposite operation. In the above configuration, the negative voltage VN is output as an output voltage VNCP.

Referring back to FIG. 1, further description will be given. The I/O buffer 120 holds the write data and address signals received from the CPU 2. The I/O buffer 120 supplies the column address signal CA to the column decoder 30. The I/O buffer 120 supplies the row address signal RA to the row decoder 20. The I/O buffer 120 supplies the write data to the latch circuit 50. The I/O buffer 120 also holds the data read from the memory cell MC and outputs it to CPU 2.

On the basis of a command signal provided by CPU 2, the write state machine 130 controls the operation of each of the circuits contained in the flash memory 3 as well as timings for data write, erase, and read operations. The write state machine 130 also executes a predetermined algorithm for each operation.

Now, description will be given of the configuration of the 2Tr flash memory configured as described above. In the example below, for simplification of description, the memory cell array is assumed to have four word lines, four bit lines, and (4×4) memory cells. "0" data is defined as the state where electrons are injected into the floating gate of the memory cell MC to make the threshold voltage of the memory cell MC positive. "1" data is defined as the state where no electrons are injected into the floating gate of the memory cell MC, thus making the threshold voltage of the memory cell MC negative.

<Write Operation>

Figure 9:
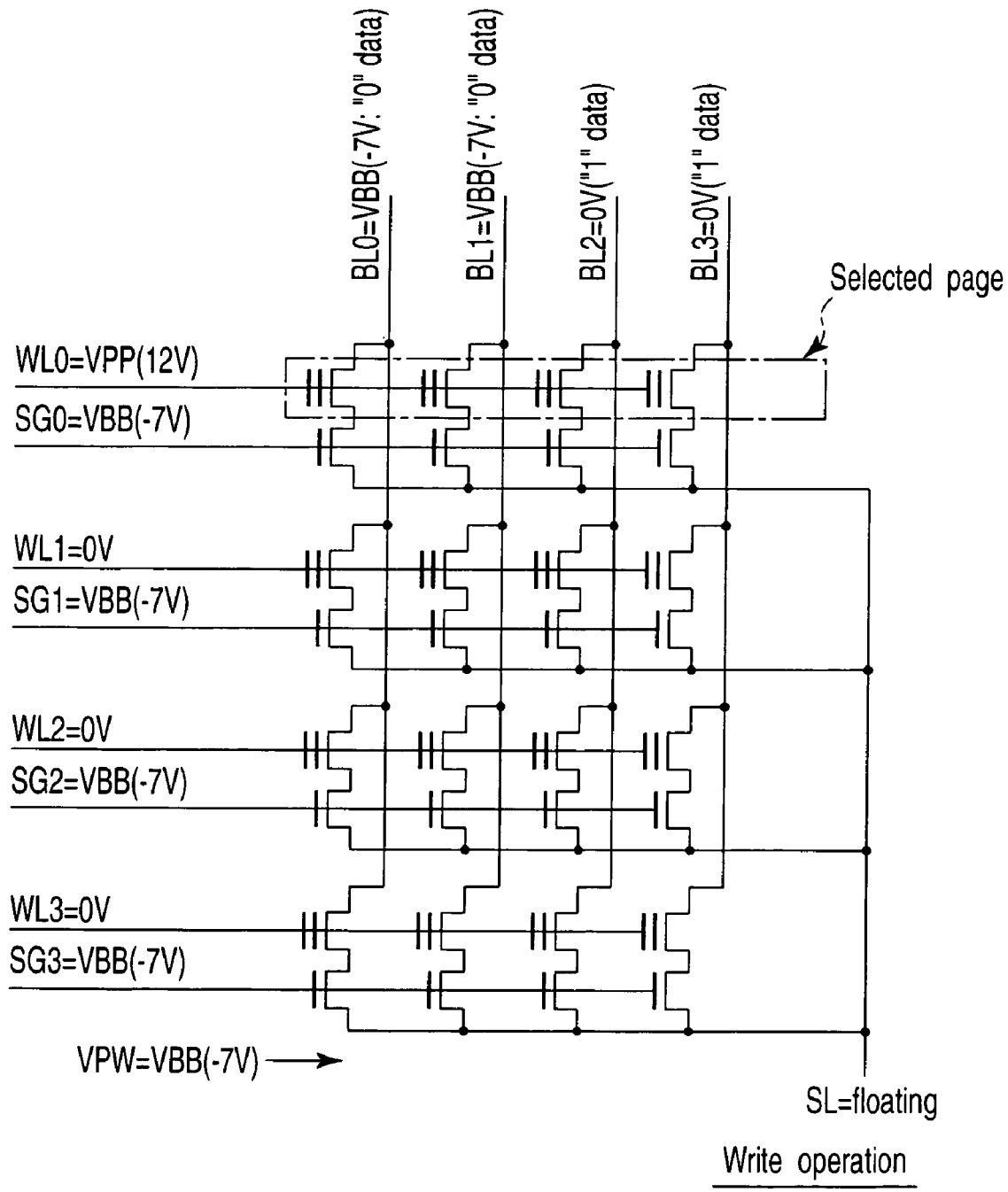
FIG. 9 is a circuit diagram of a memory cell array provided in the flash memory in accordance with the first embodiment of the present invention and in which a write operation is being performed.

First, a data write operation will be described with reference to FIG. 9. FIG. 9 is a circuit diagram of the memory cell array 10 during a write operation. Data is simultaneously written to a plurality of memory cells (which are collectively called one page) connected to one word line. In the description of the example below, data is written into the memory cells MC connected to the word line WL0.

First, before a data write operation, the charge pumps 80 and 90 start operations to generate a positive voltage VP and a negative voltage VN, respectively. Moreover, in response to commands from the write state machine 130 and controller 60, the regulators 100 and 110 generate a positive voltage VPCP=VPP (for example, 12V) and a negative voltage VNCP=VBB (for example, −7V), respectively, on the basis of the positive voltage VP and the negative voltage VN. During the write operation, the enable-signal REGEN is at the "H" level, and the test signal TEST is at the "L" level. Accordingly, in the regulator 100, shown in FIG. 7, the MOS transistors 223 and 224 are on, while the MOS transistor 230 is off. Consequently, when the resistance values of the resistance elements 227 to 230 are defined as R2, R1, r2, and r1, respectively, the positive voltage VPCP=Vref·(R1R2+R1r2+R2r2)/(R1R2+R1r2). In the regulator 110, shown in FIG. 8, the MOS transistors 240 and 248 are on, while the MOS transistors 241 and 249 are off. Consequently, when the resistance values of the resistance elements 244 to 247 are defined as R2, R1, r2, and r1, respectively, the negative voltage VNCP=−Vref·(R1/R2).

The latch circuit 50 holds write data provided by CPU 2 for each bit line. The latch circuit 50 holding "0" data outputs the negative voltage VBB to the corresponding bit line. The latch circuit 50 holding "1" data outputs 0V. In the description below, it is assumed that "0" data is written into the memory cells MC connected to the bit lines BL0 and BL1 and that "1" data is written into the memory cells MC connected to the bit lines BL2 and BL3.

Then, the row decoder 20 selects the word line WL0 and applies the positive voltage VPP to the word line WL0. The row decoder 20 provides 0V to the other unselected word lines WL1 to WL3. Moreover, the row decoder 20 provides the negative voltage VBB to all the select gate lines SG0 to SG3. The row decoder 20 sets the potential VPW of the p-type well region 202, in which the memory cells are formed, to VBB. The potential of the source line SL floats.

As a result, in the memory cell transistors MT connected to the bit lines BL0 and BL1 and word line WL0, there is a sufficient potential difference between the gate and the channel (VPP−VBB=19V). Consequently, electrons are injected into the floating gates by FN tunneling. The threshold of each of the memory cells changes from a negative value to a positive value. That is, "0" data is written into the memory cells. On the other hand, in the memory cell transistors MT connected to the bit lines BL2 and BL3 and word line WL0, there is an insufficient potential difference between the gate and the channel (VPP=12V). Consequently, no electrons are injected into the floating gates. The memory cells-MC thus maintains a negative threshold. That is, "1" data is written into the memory cells.

As described above, the data is written into one page of memory cell transistors at a time.

<Erase Operation>

Now, a data erase operation will be described with reference to FIG. 10. FIG. 10 is a circuit diagram of the memory cell array 10 during an erase operation. Data is simultaneously erased from all the memory cells sharing the p-type well region 202. The erase operation is performed by pulling electrons out of the floating gate by FN tunneling. The operations of the charge pumps 80 and 90 and regulators 100 and 110 during the erase operation have been as described for the write operation.

The row decoder 20 applies VBB to all the word lines WL0 to WL3. The row decoder 20 further makes all the select gate lines SG0 to SG3 float electrically and provide VPW, the positive voltage VPP, to the select gate lines SG0 to SG3. The source line and all the bit lines BL0 to BL3 float electrically.

As a result, electrons are pulled out of the floating gate of the memory transistor MT and then into the well region 202 by FN tunneling. This erases data from all the memory cells MC connected to the word lines WL0 to WL3 to make the threshold voltage negative. In this manner, the data is erased at a time. The positive voltage VPP may be applied to the select gate lines SG0 to SG3. This makes it possible to suppress voltage stress that may be placed on the gate insulating film 203 in the select transistor ST.

<Read Operation>

Now, a read operation will be described with reference to FIG. 11. FIG. 11 is a circuit diagram of the memory cell array 10 during a read operation. Data can be read simultaneously from a plurality of memory connected to one of the word lines. With reference to FIG. 11, description will be given of the case where data is read from the memory cells connected to the word line WL0.

First, the bit lines BL0 to BL3 are precharged up to a predetermined precharge voltage. Then, the row decoder 20 selects the select gate line SG0 and applies a positive voltage Vcc2 (for example, 3V) to the select gate line SG0. The positive voltage Vcc2 may be externally provided or generated by the charge pump 80. All the word lines WL0 to WL3, the source line SL, and the well potential VPW are set at 0V.

Then, the select transistors ST connected to the select gate line SG0 are turned on. Accordingly, if "1" data is written into the memory cell transistors MT connected to the selected word line WL0, a current flows from the bit line to the source line. On the other hand, if "0" data is written, no current flows. An amplifier (not shown) amplifies a change in the potential of the bit line resulting from a current flowing through the memory cell MC.

The data read operation is performed as described above.

<Die-Sort Test>

Now, a die-sort test will be described. Unlike the normal write, read, and erase operations described above, the die-sort test checks whether or not manufactured semiconductor chips sufficiently meet required product specifications before the products are shipped. The die-sort test involves a plurality of test steps. The test steps include a step of conducting a test by writing "0" data into all the memory cells. In this test, "0" data is written into all the memory cells and those memory cells into which the "0" data has not successfully been written are determined to be defective. Then, the addresses of these memory cells are identified. The test steps include the opposite step, that is, a step of conducting a test by writing "1" data into all the memory cells.

Figure 12:
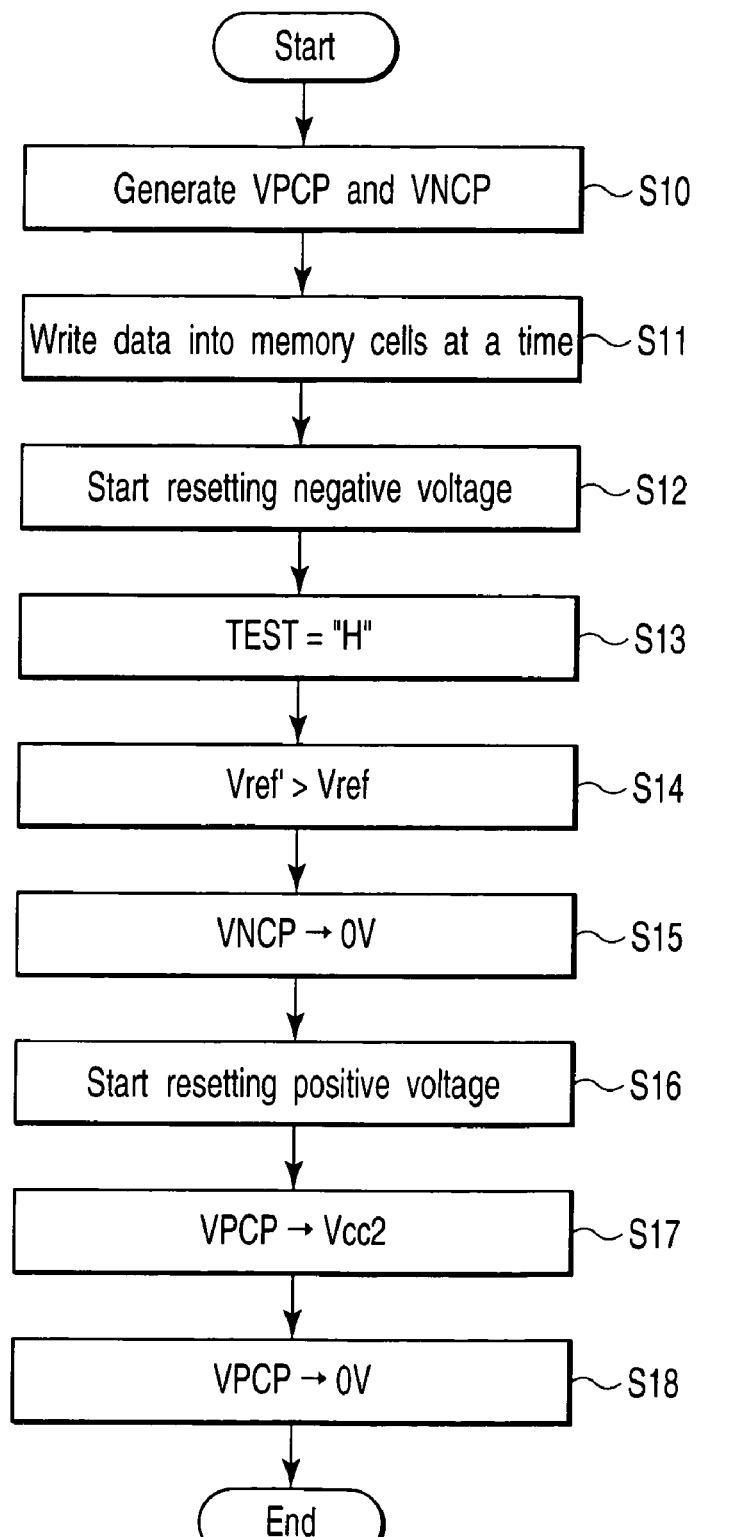
FIG. 12 is a flowchart of a die-sort test on the flash memory in accordance with the first embodiment of the present invention.
Figure 13:
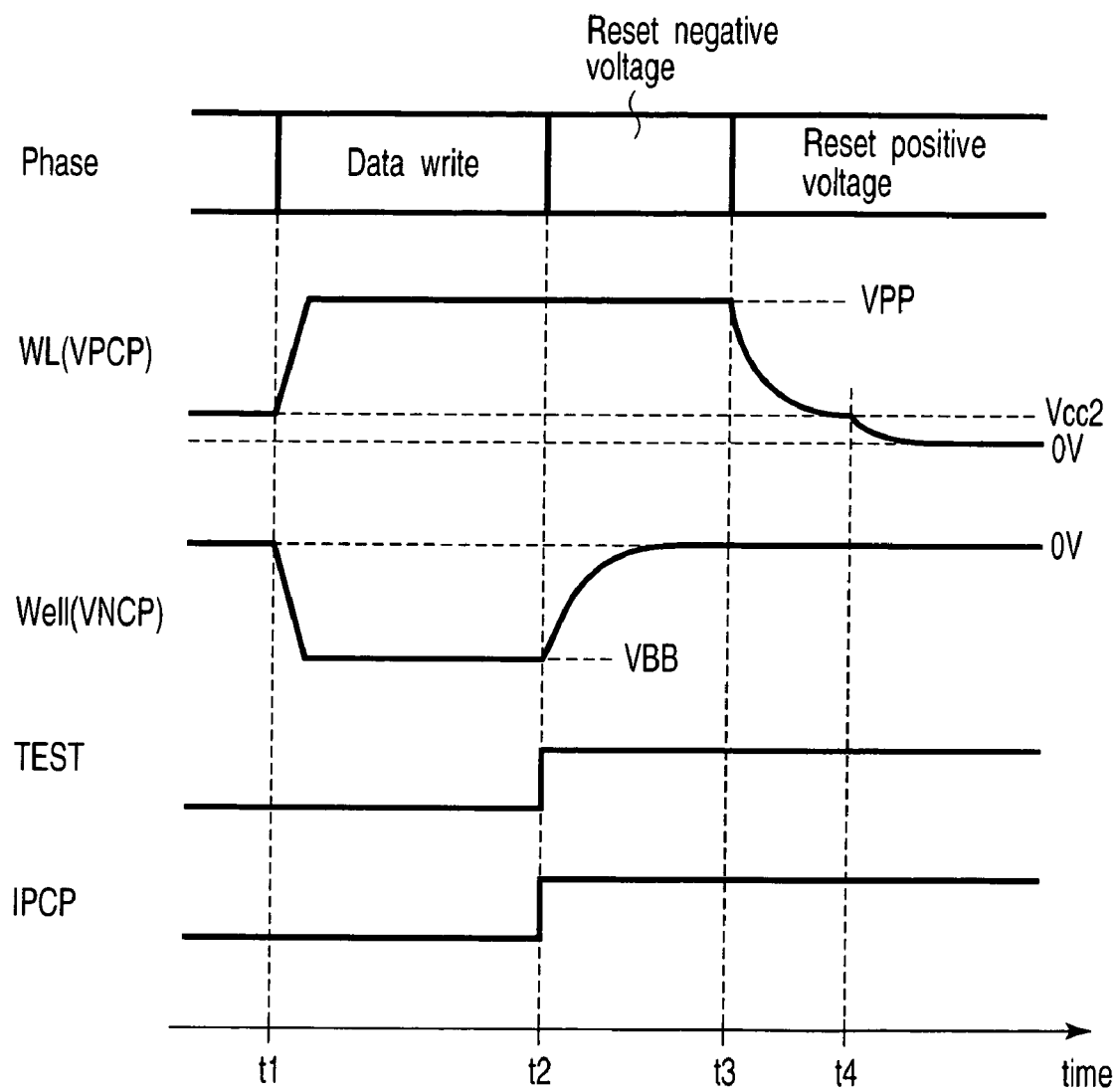
FIG. 13 is a timing chart of various signals resulting from the die-sort test on the flash memory in accordance with the first embodiment of the present invention.

Description will be given below of the case where "0" data is written. FIG. 12 is a flowchart of a die-sort test showing a flow from an operation of writing "0" data to an operation of resetting the positive voltage VPCP and negative voltage VNCP. FIG. 13 is a timing chart of the voltages of nodes during execution of the flow shown in FIG. 12.

Specifically, FIG. 13 shows a timing chart of the voltage of the word line (node to which the positive voltage VPCP is applied), the voltage of the well region 202 (node to which the negative voltage VNCP is applied), the test signal TEST, and the current IPCP (see FIG. 7), flowing through the output node of the regulator 100.

First, in response to a command from the write state machine, the regulators 100 and 110 generate a positive voltage VPCP (=VPP) and a negative voltage VNCP (=VBB) (step S10). This operation is performed as described above for the write operation.

Figure 14:
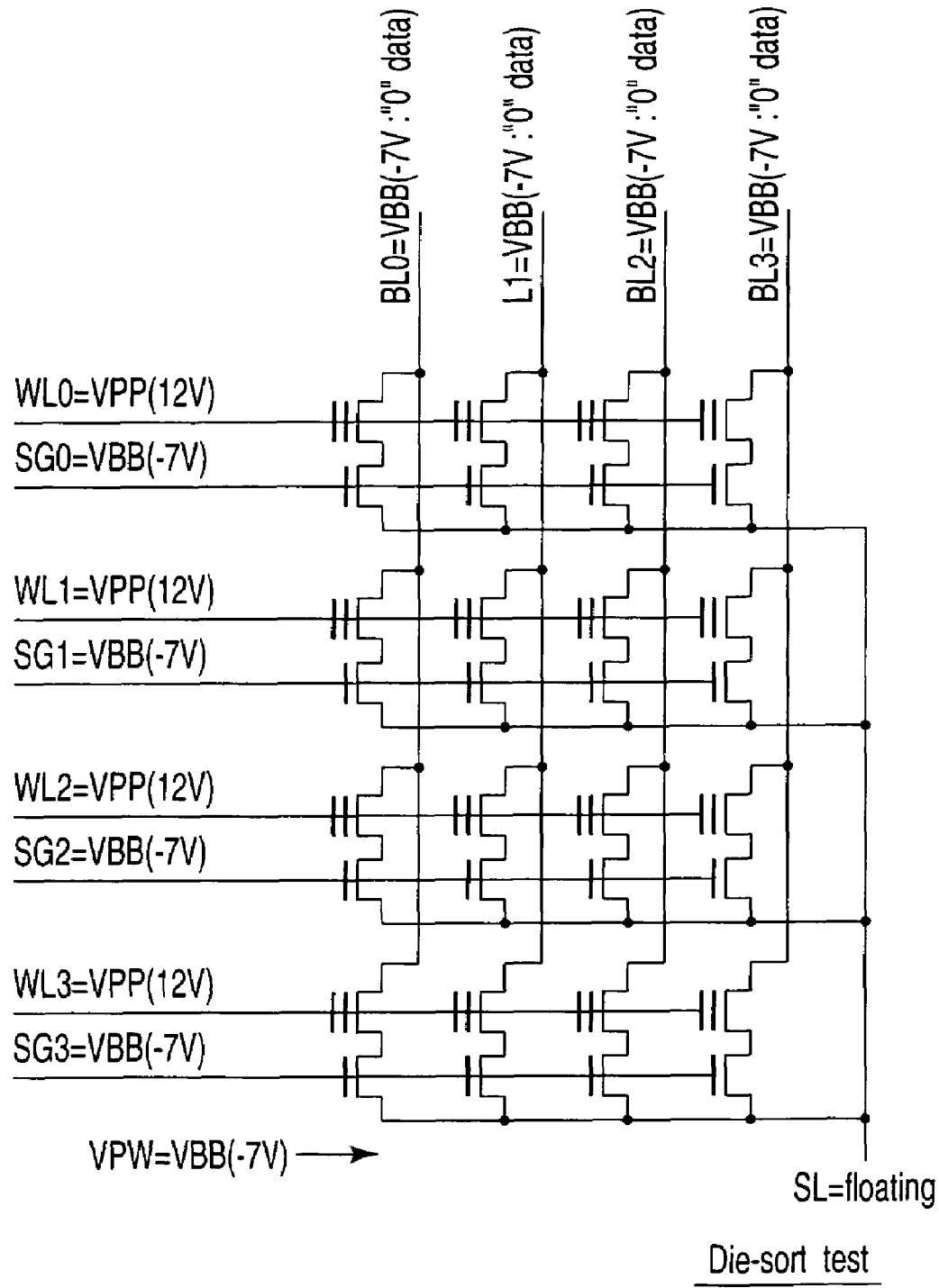
FIG. 14 is a circuit diagram of a memory cell array provided in the flash memory in accordance with the first embodiment of the present invention and on which the die-sort test is being conducted.

Then, "0" data is written into all the memory cells MC (step S11, time t1). FIG. 14 shows how the memory cell array 10 operates on this occasion. FIG. 14 is a circuit diagram of the memory cell array 10. As shown in the figure, the row decoder 20 applies the positive voltage VPP, output by the regulator 100, to all the word lines WL0 to WL3. The row decoder 20 also applies the negative voltage VBB, output by the regulator 110, to all the select gate lines SG0 to SG3 and well region 202. Further, the latch circuit 50 applies the negative voltage VBB, output by the regulator 110, to all the bit lines BL0 to BL3. As a result, "0" data is written into all the memory cells MC at a time.

Once the data write operation is finished, an operation of resetting the negative voltage VNCP is first started (step S12). TO reset the negative voltage VNCP, the test signal TEST is set to the "H" level (step S13, time t2). Then, in the regulator 100, shown in FIG. 7, the MOS transistor 224 is turned on, while the MOS transistor 225 is turned off. Consequently, Vref'>Vref (step S14). In this state, the negative voltage VNCP is reset from VBB to 0V (step S15). That is, the voltage VPW of the well region 202 is reset from the negative voltage VBB to 0V.

Next, an operation of resetting the positive voltage VPCP is started (step S16, time t3). To reset the positive voltage VPCP, the voltage is lowered from VPP (12V) to Vcc2 (3) (step S17) and then reset from Vcc2 to 0V. As a result, the voltages of all the word lines WL0 to WL3 are reset from the positive voltage VPP to 0V. The reset operation is thus completed.

Description has been given of the case where the negative voltage VNCP is reset earlier. However, the positive voltage VPCP may be reset earlier. In this case, in FIG. 12, step S12 may be replaced with step S16, and step S15 may be replaced with step S17. In step S13, when the test signal TEST is set to the "H" level, the MOS transistors 241 and 249 in the regulator 110, shown in FIG. 8, are turned on.

As described above, the 2Tr flash memory 3 in accordance with the first embodiment of the present invention comprises the regulators 100 and 110, which output the positive voltage VPCP and negative voltage VNCP, respectively. During a voltage reset operation associated with a test operation, the regulators 100 and 110 have their output impedances lowered. This makes it possible to suppress the adverse effect of coupling caused by voltage resetting. The test costs can thus be reduced while improving the reliability of the memory cells. This effect will be described below in detail.

A parasitic capacitance is present between the control gate of the memory cell and the well region. Accordingly, a variation in the voltage of one of the control gate and well region varies the voltage of the other owing to coupling caused by the parasitic capacitance. This also applies to the voltage reset operation. Consequently, if no measures are taken for the coupling, the problems described below may occur.

Figure 15:
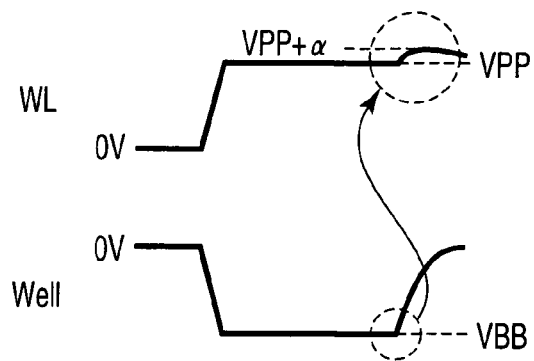
FIG. 15 is a timing chart of a word line potential and a well potential in which the well potential is reset before the word line potential is in a conventional flash memory.

FIG. 15 is a timing chart of the voltages of the word line and well region, showing that the voltage of the well region is reset from VBB to 0V before the voltage of the word line is. As shown in the figure, the moment the voltage of the well region is reset from VBB to 0V, the voltage of the word line rises to VPP+α. The variation α increases in proportion to the parasitic capacitance. Accordingly, even if α presents no particular problem for, for example, a normal write operation for each page, the adverse effect of α may not be negligible for an operation of writing data into all the memory cells at a time during a test. Specifically, the voltage of the word line may exceed the breakdown voltage of the gate insulating film in the memory cell. This may make the memory cell defective.

Figure 16:
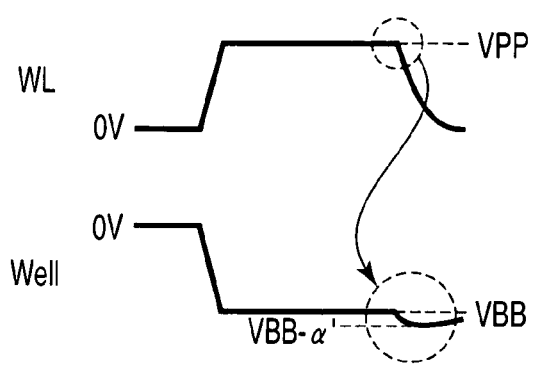
FIG. 16 is a timing chart of the word line potential and the well potential in which the word line potential is reset before the well potential is in the conventional flash memory.

FIG. 16 is a timing chart of the voltages of the word line and well region, showing that the voltage of the word line is reset from VPP to 0V before the voltage of the well region is. Also in this case, the moment a reset operation is started, the voltage of the well region lowers to VBB−α' owing to coupling. The voltage of the well region decreases by the amount equal to the variation α' to break the memory cell, which thus becomes defective.

Figure 17:
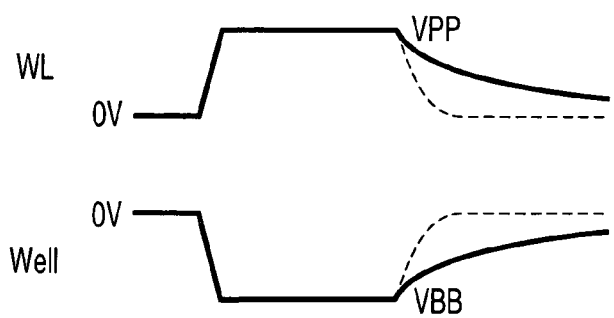
FIG. 17 is a timing chart of the word line potential and the well potential in which the word line potential and the well potential are simultaneously reset in the conventional flash memory.

FIG. 17 is also a timing chart of the voltages of the word line and well region, showing that the voltages of the word line and well region are simultaneously reset. As shown in the figure, in this case, overshoot does not occur in the voltages of the word line and well region, thus avoiding the breakdown voltage problem. However, the voltages of the word line and well region are reset to 0V while being affected by coupling. This makes it difficult to perform a quick reset operation. Broken lines in the figure each show a variation in voltage observed when the voltage of the word line or well region is solely reset. Therefore, the time required for a write operation during a test process increases and the memory is stressed for a longer time. This may result in an overwrite or a miswrite.

As previously described, the die-sort test includes a step of writing the same data into all the bits. The total test time T is expressed as T ∝ (C/N)·W where N denotes the number of bits (cells) into which data can be written at a time, W denotes the time required for a write operation, and C denotes the capacity of the memory cell. Accordingly, the time required for a test and thus test costs can be reduced by increasing the number of bits into which data can be written at a time. However, the adverse effect of coupling is also enhanced by increasing the number of bits into which data can be written at a time. The enhanced adverse effect of coupling causes the memory cell breakdown voltage problem because of coupling noise as described with reference to FIGS. 15 and 16. Then, an attempt to solve the breakdown voltage problem makes it difficult to perform a quick reset operation as described with reference to FIG. 17. That is, the coupling noise affects the number of bits required to reduce the test time. This may disadvantageously increase the test costs.

However, the configuration in accordance with the present embodiment makes it possible to reduce coupling noise while increasing the number of bits into which data can be written at a time. This enables the test to be conducted quickly and inexpensively. This will be described below taking the case where the negative voltage VNCP is reset before the positive voltage VPCP is.

Figure 18:
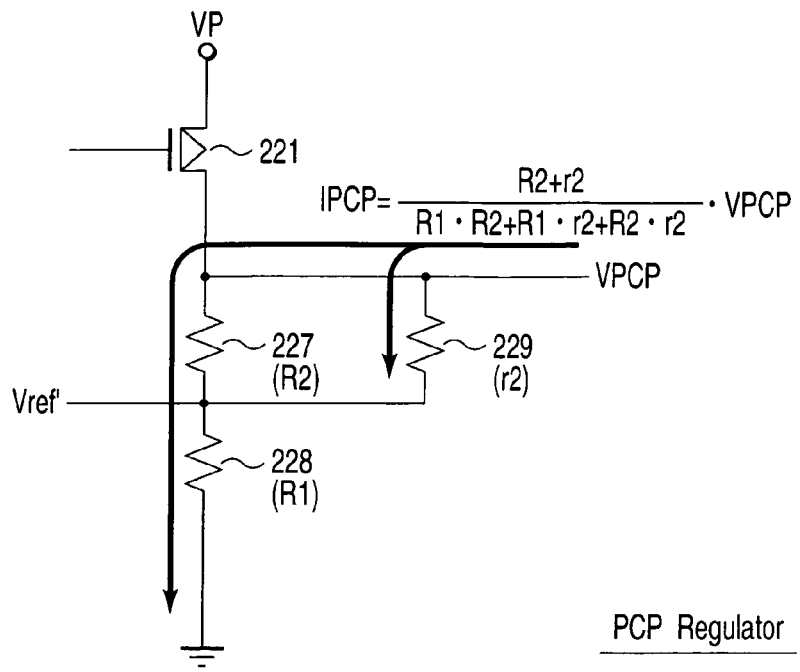
FIG. 18 is a circuit diagram of the positive voltage regulator provided in the flash memory in accordance with the first embodiment of the present invention and which is not performing a positive voltage reset operation.

The test signal TEST is always at the "L" level except during a reset operation associated with a test operation. The regulator 100 is equivalent to the configuration shown in FIG. 18. FIG. 18 is a circuit diagram of the regulator 100. The illustration of the comparator 226 and MOS transistors 220 and 222 is omitted. With the present configuration, the current IPCP=VPCP·(R2+r2)/(R1R2+R1r2+R2r2).

Figure 19:
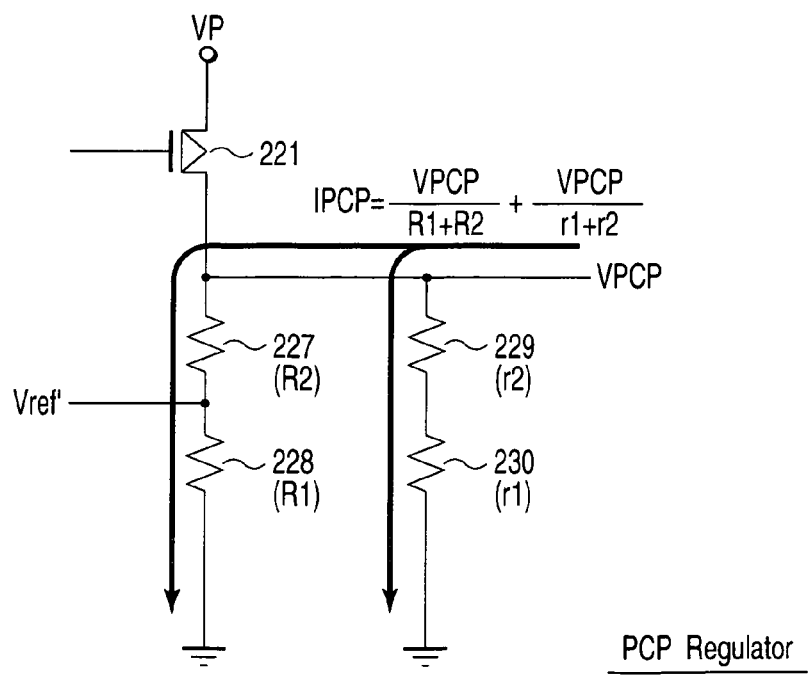
FIG. 19 is a circuit diagram of the positive voltage regulator provided in the flash memory in accordance with the first embodiment of the present invention and which is performing a positive voltage reset operation.

In contrast, during a reset operation associated with a test operation, the test signal TEST is at the "H" level. Accordingly, the regulator 100 is equivalent to the configuration shown in FIG. 19. FIG. 19 is a circuit diagram of the regulator 100. The illustration of the comparator 226 and MOS transistors 220 and 222 is omitted. With the present configuration, the current IPCP=[VPCP/(R1+R2)]+[VPCP/(r1+r2)].

That is, the current IPCP is larger during a rest operation associated with a test operation than during the other periods. In other words, the output impedance of the regulator 100 decreases. As a result, the node to which the voltage VPCP is applied is unlikely to undergo coupling noise. Accordingly, even if the negative voltage VNCP is reset at the time t2 as shown in FIG. 13, the positive voltage VPCP is less significantly affected by coupling. This makes it possible to increase the number of bits into which data can be simultaneously written. For example, data can be simultaneously written into all the bits as described in the present embodiment. It is thus possible to reduce the test time and costs.

In the above description, the positive voltage VPCP is reset earlier. However, the description also applies to the case where the negative voltage VNCP is reset earlier. During a reset operation, in the regulator 110, shown in FIG. 8, a path is activated which extends from the VNCP node to Vcc1 (positive power supply potential node) via the resistance elements 247 and 246. A current then flows through this path. This reduces the output impedance of the regulator 110, thus enabling a reduction in coupling noise.

Further, an operation of simultaneously writing data in all the bits or plural pages is allowed to be performed only during tests before shipment. The power consumption of the regulator 100 increases only during a reset operation associated with a test operation. Therefore, the performance of the products is unlikely to be degraded.

Figure 20:
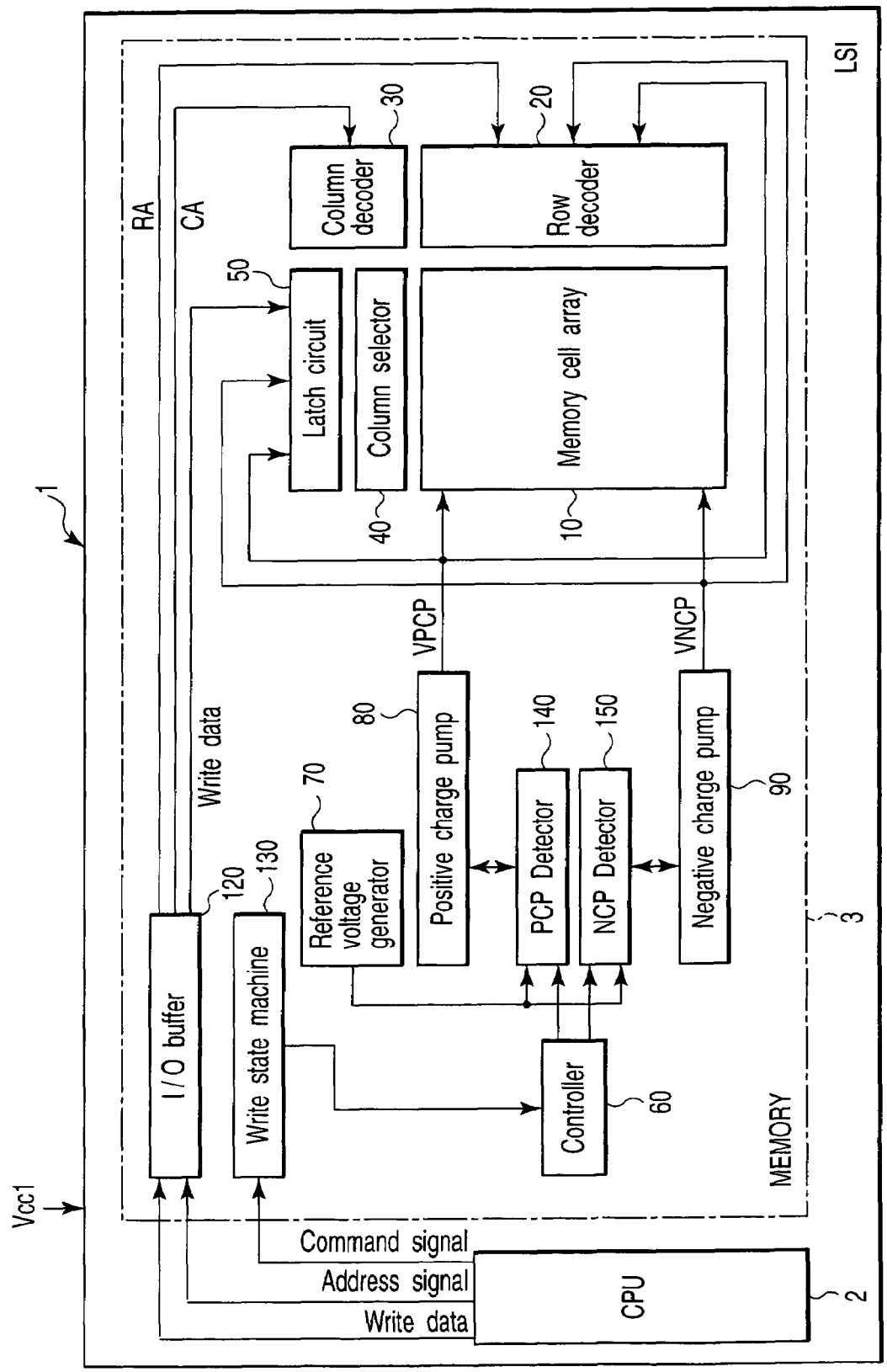
FIG. 20 is a block diagram of LSI in accordance with a second embodiment of the present invention.

Now, with reference to FIG. 20, description will be given of a semiconductor memory device and a method of controlling the semiconductor memory device in accordance with a second embodiment. FIG. 20 is a block diagram of a system LSI in accordance with the present embodiment. The present embodiment corresponds to the first embodiment in which the charge pumps 80 and 90 are controlled so that the voltages VP and VN are set at desired voltage levels to output the positive voltage VPCP and the negative voltage VNCP.

As shown in the figure, the system LSI corresponds to the configuration which is shown in FIG. 1 and described in the first embodiment and in which the regulators 100 and 110 are omitted, whereas a positive voltage detector 140 and a negative voltage detector 150 are provided. The positive voltage detector 140 detects the voltage level of a positive voltage VPCP generated by the charge pump 80. On the basis of the detection, the positive voltage detector 140 controls the charge pump 80. The negative voltage detector 150 detects the voltage level of a negative voltage VNCP generated by the charge pump 90. On the basis of the detection, the negative voltage detector 150 controls the charge pump 90.

FIG. 21 is a circuit diagram showing an example of the configuration of the positive voltage detector 140. As shown in the figure, the positive voltage detector 140 comprises p-channel MOS transistors 260 and 261, resistance elements 262 to 265, n-channel MOS transistors 266 and 267, and a comparator 268. The output voltage VPCP from the charge pump 80 is applied to a source of the MOS transistor 260. The inverse enable signal /EN is input to a gate of the MOS transistor 260. The output voltage VPCP from the charge pump 80 is applied to a source of the MOS transistor 261. The inverse test signal /TEST is input to a gate of the MOS transistor 261. A drain of the MOS transistor 260 is connected to one end of the resistance element 262. A drain of the MOS transistor 261 is connected to one end of the resistance element 264. The other ends of the resistance elements 262 and 264 are connected together. Furthermore, the other ends of the resistance elements 262, 264 are connected to one ends of the resistance elements 263, 265. The other ends of the resistance elements 263 and 265 are connected to drains of the MOS transistors 266 and 267, respectively. The enable signal EN and the test signal TEST are input to gates of the MOS transistors 266 and 267, respectively. Sources of the MOS transistors 266 and 267 are grounded. The comparator 268 compares a reference voltage Vref generated by the reference voltage generator 70 with the voltage Vref' of a connection node for the resistance elements 262, 263, 264, and 265. The comparator 268 then outputs the comparison as positive voltage detection signal VDETPCP. The enable signal EN is at the "H" level whenever voltages generated by the charge pumps 80 and 90 are supplied to other circuit blocks.

FIG. 22 is a circuit diagram showing an example of the configuration of the negative voltage detector 150. As shown in the figure, the negative voltage detector 150 comprises p-channel MOS transistors 280 and 281, resistance elements 282 to 285, n-channel MOS transistors 286 and 287, and a comparator 288. For example, the voltage Vcc1 is applied to a source of the MOS transistor 280. The inverse enable signal/EN is input to a gate of the MOS transistor 280. For example, the voltage Vcc1 is applied to a source of the MOS transistor 281. The inverse test signal/TEST is input to a gate of the MOS transistor 281. A drain of the MOS transistor 280 is connected to one end of the resistance element 282. A drain of the MOS transistor 281 is connected to one end of the resistance element 284. The other ends of the resistance elements 282 and 284 are connected together. Furthermore, the other end of the resistance element 282 is connected to one end of the resistance element 286, and the other end of the resistance element 284 is connected to one end of the resistance element 285. The other ends of the resistance elements 283 and 285 are connected to drains of the MOS transistors 286 and 285, respectively. The enable signal EN and the test signal TEST are input to gates of the MOS transistors 286 and 287, respectively. The output voltage VNCP from the charge pump 90 is applied to sources of the MOS transistors 286 and 287. The comparator 288 compares a reference voltage Vref generated by the reference voltage generator 70 with the voltage Vref' of a connection node for the resistance elements 282, 283, 284, and 285. The comparator 288 then outputs the comparison as negative voltage detection signal VDETNCP.

FIG. 23 is a circuit diagram of the positive charge pump 80. As shown in the figure, the charge pump 80 comprises an oscillator section 270 and a charge pump section 280. The oscillator section 270 comprises a NAND gate 271 and inverters 272 to 274. A plurality of the inverters 272 are connected in series. The inverter 273 inverses an output from the final inverter 272, and the inverter 274 inverses an output from the inverter 273. The NAND gate 271 executes a NAND calculation on the positive voltage detection signal VDETPCP provided by the positive voltage detector 140 and the output from the final inverter 272. An output from the NAND gate 271 is input to the first inverter 272. In this configuration, the inverter 273 outputs a clock signal φPCP. The inverter 274 outputs an inverse clock signal /φPCP.

The configuration of the charge pump section 280 is similar to that shown in FIG. 5 and described in the first embodiment. Instead of the clock signals φ and /φ shown in FIG. 5, the clock signals φPCP and /φPCP output by the oscillator section 270 are input to the charge pump 280. The charge pump section 280 supplies the output voltage VP to each circuit block, as the positive voltage VPCP.

The configuration of the negative charge pump 90 is similar to that shown in FIG. 23. However, the configuration of the charge pump section 280 in the negative charge pump 90 is similar to that shown in FIG. 6 and described in the first embodiment. When φPCP and /φPCP in FIG. 23 are changed to φNCP and /φNCP, respectively, clock signals φNCP and /φNCP are input to the negative charge pump 90 in place of the clock signals φ and /φ, shown in FIG. 6. The charge pump section 280 supplies the output voltage VN to each circuit block, as the negative voltage VNCP.

Now, description will be given of the operation of the 2Tr flash memory in accordance with the present embodiment. The relationship between the voltages and the memory cell array is the same as that shown in FIGS. 10 and 11 and described for a write, read, and erase operations in the first embodiment. Accordingly, description will be given of the operations of the voltage detector 140 and the charge pumps 80 and 90 during a write, read, and erase operations.

As described in the first embodiment, the test signal TEST is always at the "L" level except during a voltage reset operation associated with a test operation. Consequently, the MOS transistors 261 and 267, provided in the positive voltage detector 140, are off. The enable signal EN is always at the "H" level. Accordingly, when the resistance values of the resistance elements 262 and 263 are defined as R2 and R1, Vref'=R1·VPCP/(R1+R2). The comparator 268 compares Vref with Vref', and when Vref'>Vref, sets the positive voltage detection signal VDETPCP to the "L" level. When the positive voltage detection signal VDETPCP is set to the "L" level, the output from the NAND gate 271 in the charge pump 80 is fixed to the "H" level. Then, the clock signals φPCP and /φPCP are fixed to the "H" or "L" level. The charge pump section 280 thus stops raising the voltage. That is, the detection signal VDETPCP controllably makes the charge pump 80 operative or inoperative. Further, Vref' of the positive voltage detector 140 and the reference voltage Vref are set so that the positive voltage VPCP is set at the desired voltage level (for example, VPP).

This also applies to the negative voltage detector 150. The MOS transistors 281 and 287, provided in the negative voltage detector 150, are off. Accordingly, when Vref'>Vref, the comparator 288 sets the negative voltage detection signal VDETNCP to the "L" level. When the negative voltage detection signal VDETNCP is set to the "L" level, the output from the NAND gate 271 in the charge pump 90 is fixed to the "H" level. The charge pump section 280 thus stops raising the voltage. That is, the detection signal VDETNCP controllably makes the charge pump 90 operative or inoperative. Further, Vref' of the negative voltage detector 150 and the reference voltage Vref are set so that the negative voltage VNCP is set at the desired voltage level (for example, VBB).

Figure 24:
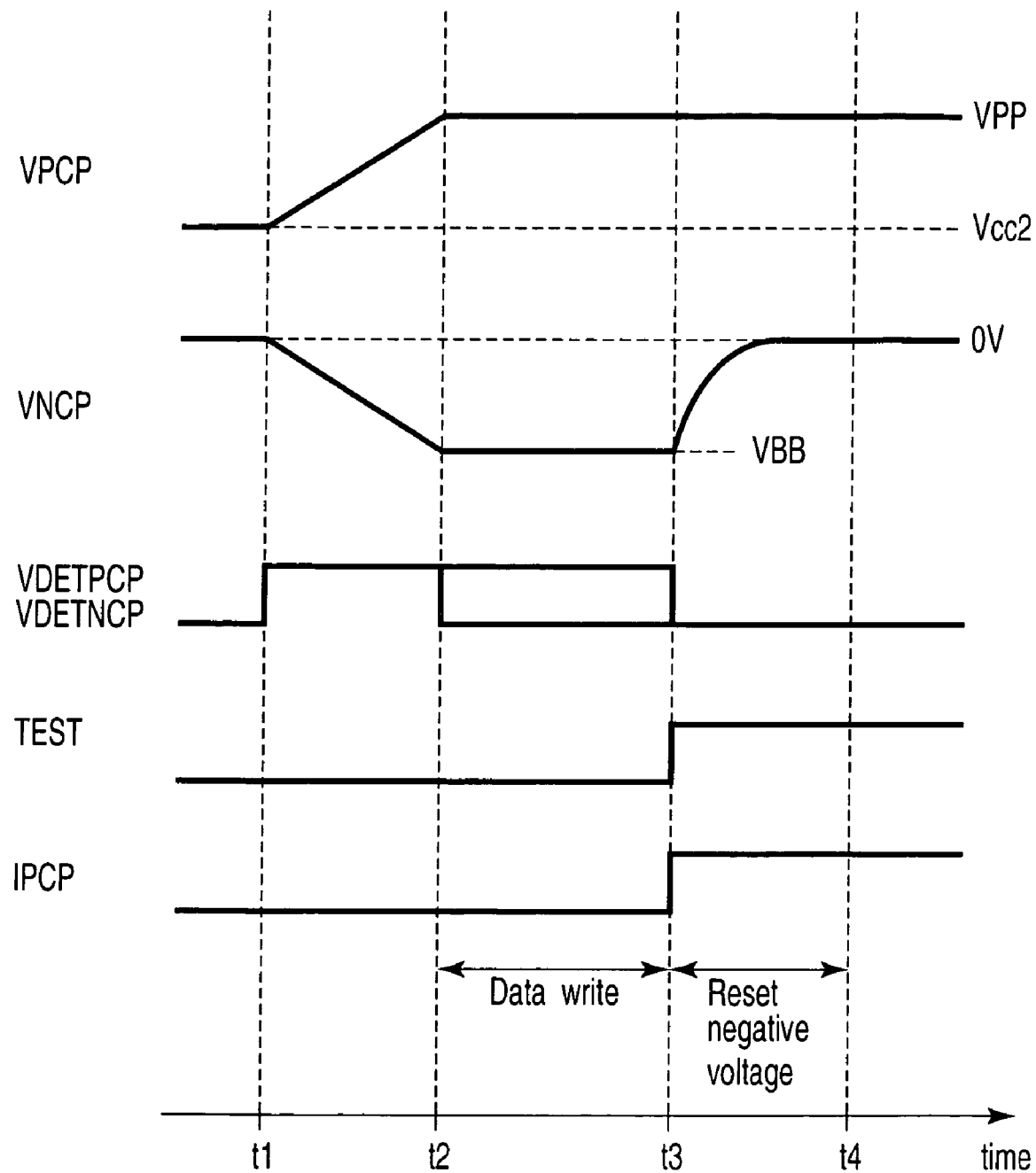
FIG. 24 is a timing chart of various signals resulting from a die-sort test on the flash memory in accordance with the second embodiment of the present invention.

Now, with reference to FIGS. 12 and 24, the operation during a die-sort test will be described taking the case where "0" data is written into all the bits at a time. FIG. 24 is a timing chart of the voltages of nodes during execution of the flow shown in FIG. 12. Specifically, FIG. 24 shows a timing chart of the output voltages VPCP and VNCP from the charge pumps 80 and 90, the detection signals VDETPCP and VDETNCP, the test signal TEST, and a current IPCP' flowing through the output node of the positive voltage detector 140. In the positive voltage detector 140, shown in FIG. 21, the current IPCP' flows from the node to which the positive voltage VPCP is provided to the ground potential (negative power supply potential node).

First, in response to a command from the write state machine 130, the enable signal EN is set to the "H" level. This causes the detectors 140 and 150 to start operations. Then, since Vref>Vref', the detection signals VDETPCP and VDETNCP are set to the "H" level. As a result, the charge pumps 80 and 90 continuously raising the voltages until VPCP=VPP and VNCP=VBB (step S10, time t1 to time t2 in FIG. 24).

When VPCP=VPP and VNCP=VBB, "0" data is written into all the memory cells MC (step S11, time t2 to time t3). On this occasion, the memory cell array 10 operates as described with reference to FIG. 14. During this period, the detectors 140 and 150 control the charge pumps 80 and 90 in accordance with the detection signals VDETPCP and VDETNCP so that VPCP=VPP and VNCP=VBB, respectively.

Once the data is written into all the memory cells, an operation of resetting the negative voltage VNCP is first performed (step S12). To reset the negative voltage VNCP, the test signal TEST is set to the "H" level (step S13, time t3). Then, in the positive voltage detector 140, shown in FIG. 21, the MOS transistors 261 and 267 are turned on. Further, in the negative voltage detector 150, the MOS transistors 281 and 285 are turned on. This results in Vref'>Vref in the detectors 140 and 150 (step S14). Therefore, both the charge pumps 80 and 90 are made inoperative. In this state, the negative voltage VNCP is reset from VBB to 0V (step S15).

Then, in steps S16 to S18, the voltage VPCP is reset from VPP to 0V. The reset operation is thus completed. In the above description, the negative voltage VNCP is reset earlier. However, the positive voltage VPCP may be reset earlier.

As described above, effects similar to those of the first embodiment are produced by the semiconductor memory device in accordance with the second embodiment of the present invention. That is, the 2Tr flash memory in accordance with the present embodiment comprises the detectors 140 and 150, which monitors the voltage levels of the output voltages VPCP and VNCP from the charge pumps 80 and 90. During a voltage reset operation associated with a test operation, the detectors 140 and 150 have their output impedances reduced. This makes it possible to reduce the adverse effect of coupling associated with voltage resetting as in the case of the first embodiment. Therefore, the test costs can be reduced while improving the reliability of the memory cells. The present effect will be described below.

As previously described, the test signal TEST is always at the "L" level except during a reset operation associated with a test operation. Accordingly, the current IPCP' is IPCP'=VPCP/(R1+R2); the current IPCP' flows from the output node for the voltage VPCP to the ground potential in the positive voltage detector 140. In contrast, during a reset operation associated with a test operation, the MOS transistors 264 and 265 are on. Thus, a path is activated which extends from the VPCP output node to the ground potential via the MOS transistor 261, the resistance elements 264 and 265, and the MOS transistor 265. Consequently, IPCP'=VPCP·(R1+r1) (R2 +r2)/[R1r1 (R2+r2)+R2r2 (R2+r1)]. In this case, r1 and r2 are the resistance values of the resistance elements 265 and 264.

That is, the current IPCP' is larger during a rest operation associated with a test operation than during the other periods. In other words, the output impedance of the positive voltage detector 140 decreases. As a result, the node to which the voltage VPCP is applied is unlikely to undergo coupling noise. Effects similar to those of the first embodiment are thus produced.

This also applies to the case where the voltage VNCP is reset before the voltage VPCP is. During a reset operation, in the detector 150 shown in FIG. 22, a path is activated which extends from the VNCP node to Vcc1 via the resistance elements 285 and 284. A current then flows through this path. Consequently, the output impedance of the detector 150 decreases, thus enabling coupling noise to be reduced.

Figure 25:
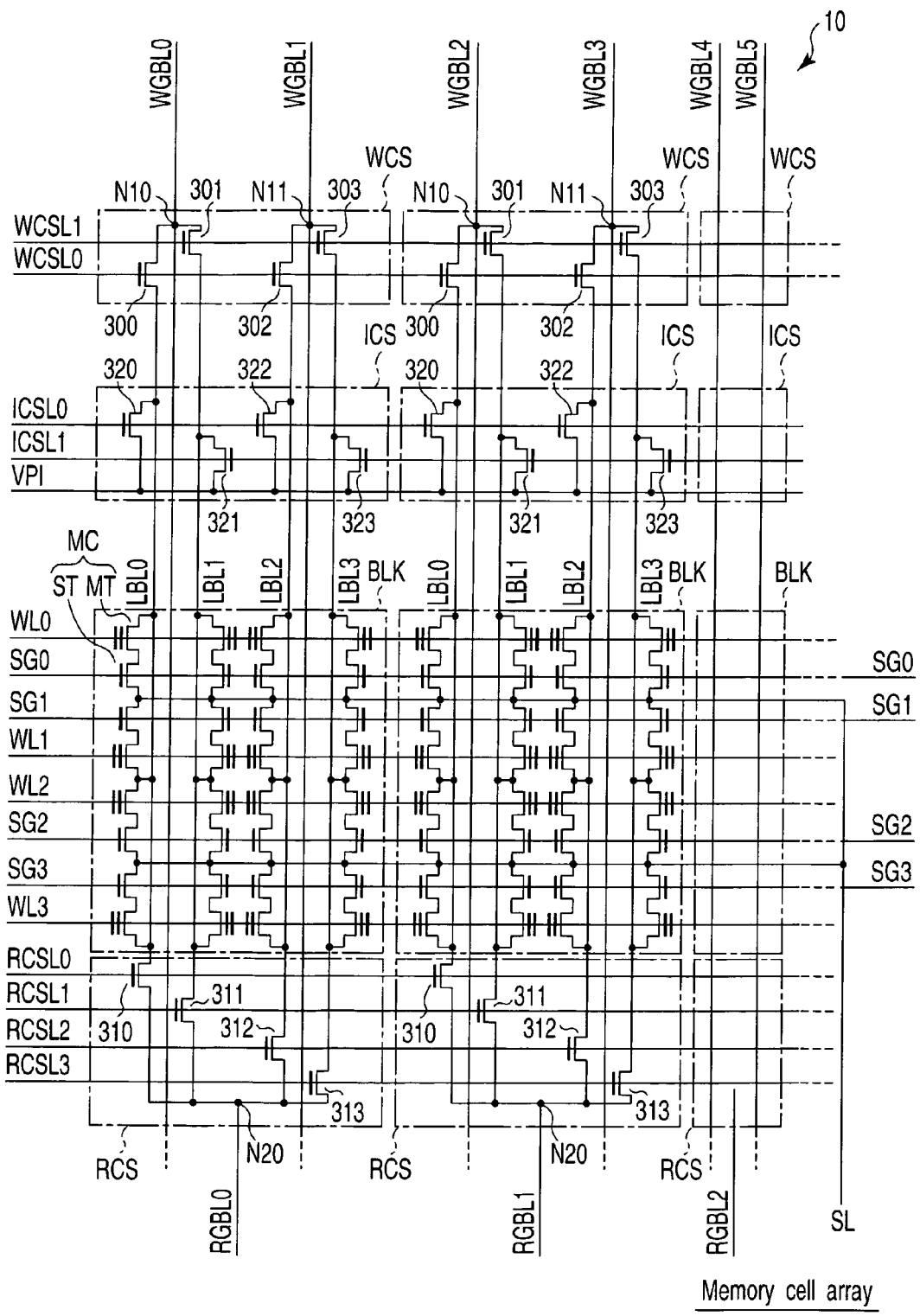
FIG. 25 is a circuit diagram of a memory cell array provided in a flash memory in accordance with a third embodiment of the present invention.
Figure 26:
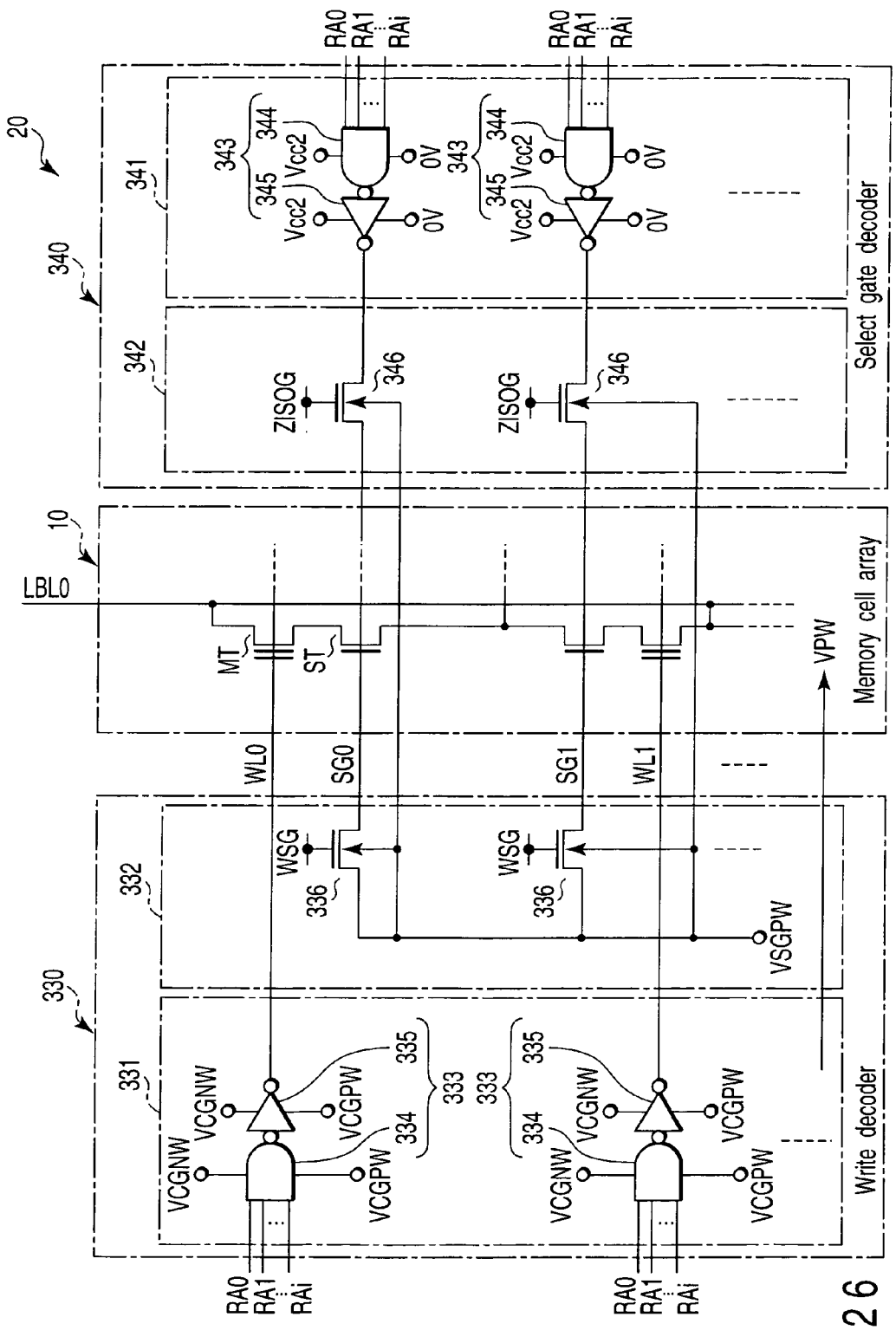
FIG. 26 is a circuit diagram of a row decoder provided in the flash memory in accordance with the third embodiment of the present invention.

Now, description will be given of a semiconductor memory device and a method of controlling the semiconductor memory device in accordance with a third embodiment. The present embodiment corresponds to the first or second embodiment in which the memory cell array 10 and the row decoder 20 are replaced with the configurations shown in FIGS. 25 and 26, respectively. FIG. 25 is a circuit diagram of the memory cell array 10. FIG. 26 is a circuit diagram of the memory cell array 10 and the row decoder 20. The remaining part of configuration of the third embodiment is similar to that of the first or second embodiment and will not be described below.

First, with reference to FIG. 25, description will be given of the configuration of the memory cell array 10 in accordance with the present embodiment. As shown in the figure, the memory cell array 10 has ((m+1)×(n +1); m and n are natural numbers) memory cell blocks BLK, write column selectors WCS, read column selectors RCS, and write inhibit column selectors ICS. Each of the write column selector WCS, read column selector RCS and inhibit column selector is provided for one of the memory cell blocks BLK.

Each of the memory cell blocks BLK includes a plurality of memory cells MC. The memory cells MC form a 2Tr flash memory. Specifically, each of the memory cells MC includes one memory cell transistor MT and one select transistor ST. Each of the memory cell blocks BLK includes (4×4) memory cells MC. The number of memory cells arranged along the columns is four in FIG. 25. However, this number is only illustrative and may be, for example, 8 or 16; the number is not limited. Four local bit lines LBL0 to LBL3 connect to drain regions of the memory cell transistors MT in the respective memory cells MC arranged in four columns. One end of each of the local bit lines LBL0 to LBL3 is connected to the write column selector WCS. The other end of the local bit line is connected to the read column selector RCS.

In the memory cell array 10, control gates of the memory cell transistors MT on the same row is connected to same one of word lines WL0 to WL (4m−1). Gates of the select transistors ST on the same row are connected to same one of select gate lines SG0 to SG (4m−1). The local bit lines LBL0 to BLB3 connect the memory cell transistors together only within each memory cell block BLK. In contrast, the word lines WL and the select gate lines SG connect the memory cell transistors and select transistors on the same row together even across the memory cell blocks.

Now, the configuration of the write column selector WCS will be described. Each of the write column selectors WCS comprises four MOS transistors 300 to 303. One end of a current path in each of the MOS transistors 300 to 303 is connected to one end of a corresponding one of the local bit lines LBL0 to LBL3, respectively. The other ends of the current paths in the MOS transistors 300 and 301 are connected together. The other ends of the current paths in the MOS transistors 302 and 303 are connected together. The common connection node between the MOS transistors 300 and 301 will be referred to as a node N10 below. The common connection node between the MOS transistors 302 and 303 will be referred to as a node N11 below. Gates of the MOS transistors 300 to 303 are connected to one of write column select lines WCSLO to WCSL (2m−1). The same write column select line WCSL (i−1) (i: 1, 3, 5, . . .) connects to the MOS transistors 300 and 302 included in the write column selectors WCS on the same row. The same write column select line WCSLi connects to the MOS transistors 301 and 303 included in the write column selectors WCS on the same row. The row decoder 20 selects one of the write column select lines WCSL0 to WCSL (2m−1) during a write operation.

Each of the nodes N10 and N11 in the write column selector WCS is connected to a corresponding one of write global bit lines WGBL0 to WGBL (2n−1). Each of the write global bit lines WGBL0 to WGBL (2n−1) connects the nodes N10 or N11 in the write column selector WCS on the same column. The write global bit lines WGBL0 to WGBL (2n−1) are connected to the latch circuit 50.

Now, the configuration of the read column selector RCS will be described. Each read column selector RCS comprises four MOS transistors 310 to 313. One end of a current path in each of the MOS transistors 310 to 313 is connected to the other end of a corresponding one of the local bit lines LBL0 to LBL3. The other ends of the current paths in the MOS transistors 310 to 313 are connected together. A common connection node for the MOS transistors 310 to 313 will be referred to as a node N20 below. Gates of the MOS transistors 310 to 313 are connected to different read column select lines RCSL0 to RCSL (4m−1). The MOS transistors 310 to 313 contained in the read column selectors RCS on the same row are connected to the same one of the read column select lines RCSL0 to RCSL (4m−1). The column select decoder 30 selects one of the read column select lines RCSL0 to RCSL (4m−1) during a read operation.

The node N20 in the read column selector RCS is connected to one of the read global bit lines RGBL0 to RGBL (n−1). Each of the read global bit lines RGBL0 to RGBL (n−1) connects the nodes N20 in the read column selector RCS on the same column. The column selector 40 selects one of the read global bit lines RGBL0 to RGBL (n−1) during a read operation.

Now, the configuration of the write inhibit column selector ICS will be described. Each write inhibit column selector ICS comprises four MOS transistors 320 to 323. One end of a current path in each of the MOS transistors 320 to 323 is connected to one end of a corresponding one of the local bit lines LBL0 to LBL3. A write inhibit voltage VPI is applied to the other ends of the current paths in the MOS transistors 320 to 323. Gates of the MOS transistors 320 to 323 are connected to one end of a corresponding one of write inhibit column select lines ICSL0 to ICSL (2m−1). The same write column select line ICSL (i−1) (i: 1, 3, 5, . . .) connects to the MOS transistors 320 and 322 included in the write inhibit column selector ICS on the same row. The same write column select line WCSLi connects to the MOS transistors 321 and 323 included in the write inhibit column selector ICS on the same row. The row decoder 20 selects one of the write inhibit column select lines ICSL0 to ICSL (2m−1) during a write operation. The number of memory cells within the memory cell block, the number of read global bit lines RGBL, and the number of write global bit lines WGBL are not limited to those described in the present example.

Now, the configuration of the row decoder 20 will be described with reference to FIG. 26. As shown in the figure, the row decoder 20 includes a write decoder 330 and a select gate decoder 340. During a write operation, the write decoder 330 applies the negative voltage VBB to the p-type well region 202, in which the memory cell array is formed, and to all the select gate lines SG0 to SG (4m−1). During an erase operation, the write decoder 330 applies the negative potential VBB to all the word lines, while applying the positive voltage VPP to the p-type well region 202. During a read operation, the select gate decoder 340 selects one of the select gate lines SG0 to SG (4m−1). The select gate decoder 340 then applies the positive potential Vcc2 to the selected select gate line.

Description will be given of the configuration of the write decoder 330 and select gate decoder 340. First, the configuration of the select gate decoder 340 will be described. The select gate decoder 340 comprises an address decode section 341 and a switch element group 342. The address decode section 341 comprises row address decoders 343 each provided for one of the select gate lines SG and operated by the power supply voltage Vcc2 to decode row address signals RA0 to RAi of (i+1) bits into a row address decode signal. The row address decoder 343 has a NAND gate 344 and an inverter 345. The NAND gate 344 executes a NAND calculation on the bits of the row address signal RA0 to RAi. The inverter 345 inverts the NAND calculation and outputs the resulting row address decode signal.

The switch element group 342 has n-channel MOS transistors 346. The MOS transistor 346 is provided for each of the select gate lines SG0 to SG (4m−1). An output from the inverter 345 is provided to a corresponding one of the select gate lines SG0 to SG (4m−1) via a current path in the MOS transistor 346. A control signal ZISOG is input to a gate of the MOS transistor 346. The control signal ZISOG turns off the MOS transistor 346 for a write and erase operations and turns it on for a read operation.

Now, the configuration of the write decoder 330 will be described. The write decoder 330 comprises an address decode section 331 and a switch element group 332. The address decode section 331 comprises row address decoders 333 each provided for one of the word lines WL0 to WL (4m−1) to decode the row address signals RA0 to RAi of (i+1) bits into a row address decode signal. The row address decoder 333 has a NAND gate 334 and an inverter 335. The NAND gate 334 executes a NAND calculation on the bits of the row address signal RA0 to RAi. The inverter 335 inverts the NAND calculation and outputs the resulting row address decode signal. A VCGNW node and a VCGPW node provide the power supply voltage to the NAND gate 334 and the inverter 335, respectively. Zero V or the positive voltage VPCP, provided by the charge pump 80, is applied to the VCGNW node. Zero V or the negative voltage VNCP, provided by the charge pump 90, is applied to the VCGPW node.

The switch element group 332 has n-channel MOS transistors 336. The MOS transistor 336 is provided for each of the select gate lines SG0 to SG (4m−1). The select gate lines SG0 to SG (4m−1) are connected to the VSGPW node via current paths in the respective MOS transistors 336. The negative voltage VNCP, provided by the charge pump 90, is applied to the VSGPW node.

Now, description will be given of the operation of the 2Tr flash memory configured as described above. Only the differences from the first embodiment will be described below.

<Write Operation>

Data is simultaneously written into a plurality of the memory cells MC connected to the same word line. However, data is simultaneously written into the following two memory cells within the same memory cell block BLK: a memory cell connected to the local bit line LBL0 or LBL1 and a memory cell connected to the local bit line LBL2 or LBL3. Description will be given below taking the case where, in FIG. 25, data is written into the memory cell transistors MT connected to the word line WL0 and local bit lines LBL0 and LBL2.

First, the write inhibit voltage VPI of 0V is provided. Then, the write decoder 30 selects the word line WL0 and applies the positive voltage VPP to the selected word line WL0. Further, the charge pump 90 provides the negative voltage VBB to the VSGPW node. Thus, in the write decoder 330, turning on the MOS transistors 336 causes the VSGPW node to apply the negative potential VBB to all the select gate lines SG0 to SG (4m−1). Moreover, the write decoder 330 applies the negative potential VBB to the p-type well region 202. The signal ZISOG is at the "L" level during a write operation. The row address decoder 341 in the select gate decoder 340 is electrically separated from the select gate lines.

Further, of the two write column select lines connected to the write column selector WCS corresponding to the memory cell block BLK containing the selected word line WL0, the write column select line WCSL0 is selected. This turns on the MOS transistors 300 and 302 in the write column selector WCS. As a result, the write global bit line WGBL0 is electrically connected to the local bit line LBL0. The write global bit line WGBL1 is electrically connected to the local bit line LBL2.

Further, all the write column select lines are unselected which are connected to the write column selectors WCS corresponding to the memory cell blocks BLK not containing the selected word line WL0. Thus, the MOS transistors 300 to 303 are turned off which are contained in the write column selectors WCS corresponding to the memory cell blocks BLK not containing the selected word line WL0.

Moreover, all the read column select lines RCSL0 to RCSL (4m−1) are unselected. This turns off the MOS transistors 310 to 313 in all the read column selector RCS. Consequently, the read global bit lines RGBL are electrically separated from the local bit lines LBL0 to LBL3.

Moreover, the write inhibit column select line ICSL1 is set to the "H" level (Vcc2) in order to turn on the MOS transistors connected to the unselected local bit lines LBL1 and LBL3. The write inhibit column select line ICSL0 is set to the "L" level, the write inhibit column select line ICSL0 being connected to the MOS transistors 320 and 322 corresponding to the selected local bit lines LBL0 and LBL2. The MOS transistors 320 and 322 are off. As a result, the write inhibit voltage VPI=0V is applied to the unselected local bit lines LBL1 and LBL3.

As a result, write data (VBB or 0V) from the write global bit line WGBL0 is provided, via the MOS transistor 320 in the write column selector WCS, to the local bit line LBL0 in the memory cell block BLK containing the selected word line WL0. Moreover, write data (VBB or 0V) from the write global bit line WGBL1 is provided, via the MOS transistor 302, to the local bit line LBL2 in the memory cell block BLK containing the selected word line WL0.

<Read Operation>

Now, a read operation will be described. Description will be given below taking the case where data is read from the memory cell transistor MT connected to the local bit line LBL0 and word line WL0.

In FIG. 25, the read column select line RCSL0 is first selected from the four read column select lines RCSL0 to RCSL3 connected to the read column selector RCS corresponding to the memory cell block containing the selected select gate line SG0. Thus, the MOS transistor 310 is turned on which is contained in the read column selector RCS corresponding to the memory cell block BLK containing the selected select gate line SG0.

Further, all the write column select lines WCSL0 to WCSL (2m−1) are unselected. This turns off all the four MOS transistors 300 to 303 in all the write column selectors WCS. Consequently, the write global bit lines WGBL are electrically separated from the local bit lines LBL0 to LBL3.

Moreover, all the write inhibit column select lines ICSL0 to ICSL (2m−1) are unselected. This turns off all the four MOS transistors 320 to 323 in all the write inhibit column selectors ICS.

Then, the read global bit line RGBL0 is precharged. After the potential of the read global bit line reaches a predetermined precharge potential, the signal ZISOG is set to the "H" level to turn on the MOS transistors 346 in the select gate decoder 340. The select gate decoder 340 selects the select gate line SG0 ("H" level: Vcc2). Further, the write decoder 330 unselects all the word lines WL0 to WL (4m−1) (sets the word lines to 0V). The write decoder 330 also sets the potential of the p-type well region 202 at 0V. During a read operation, the signal WSG is at the "L" level and the VSGPW node is electrically separated from the select gate lines.

As a result, the selected transistor ST connected to the select gate line SG0 is turned on. Data is read from the memory cell connected to the selected word line WL0 and selected local bit line LBL0 and then onto the local bit line.

<Erase Operation>

Now, an erase operation will be described. Before an erase operation, all the MOS transistors 300 to 303, 310 to 313, and 320 to 323 are set to off. Consequently, all the write global bit lines float electrically. Then, the write decoder 330 applies the negative voltage VBB to all the word lines WL0 to WL (4m−1). The write decoder 330 further applies the positive potential VPP to the p-type well region 202. During an erase operation, the signals ZISOG and WSG are at the "L" level.

As a result, electrons are pulled out of the floating gates of the memory cell transistors in the memory cells MC and then into the p-type well region 202. This erases data from all the memory cells MC to make the threshold voltage negative. The potential of each select gate line rises close to VPP owing to coupling with the p-type well region 67. Of course, the VSGPW node may apply the negative voltage VBB to the select gate lines SG0 to SG (4m−1).

<Die-Sort Test>

To write data into all the bits at a time for a die-sort test, the write decoder 330 selects all the word lines WL0 to WL (4m−1) during the above write operation. Further, all the MOS transistors 300 to 303 in the write selectors WCS are turned on. As a result, "0" data or "1" data is simultaneously written into all the memory cells contained in the memory cell array 10.

The first and second embodiment are applicable to a configuration in which bit lines are hierarchized as in the case of the present embodiment and in which the row decoder is divided into two parts; one of them is dedicated for read operations and the other is dedicated for write operations.

Figure 27:
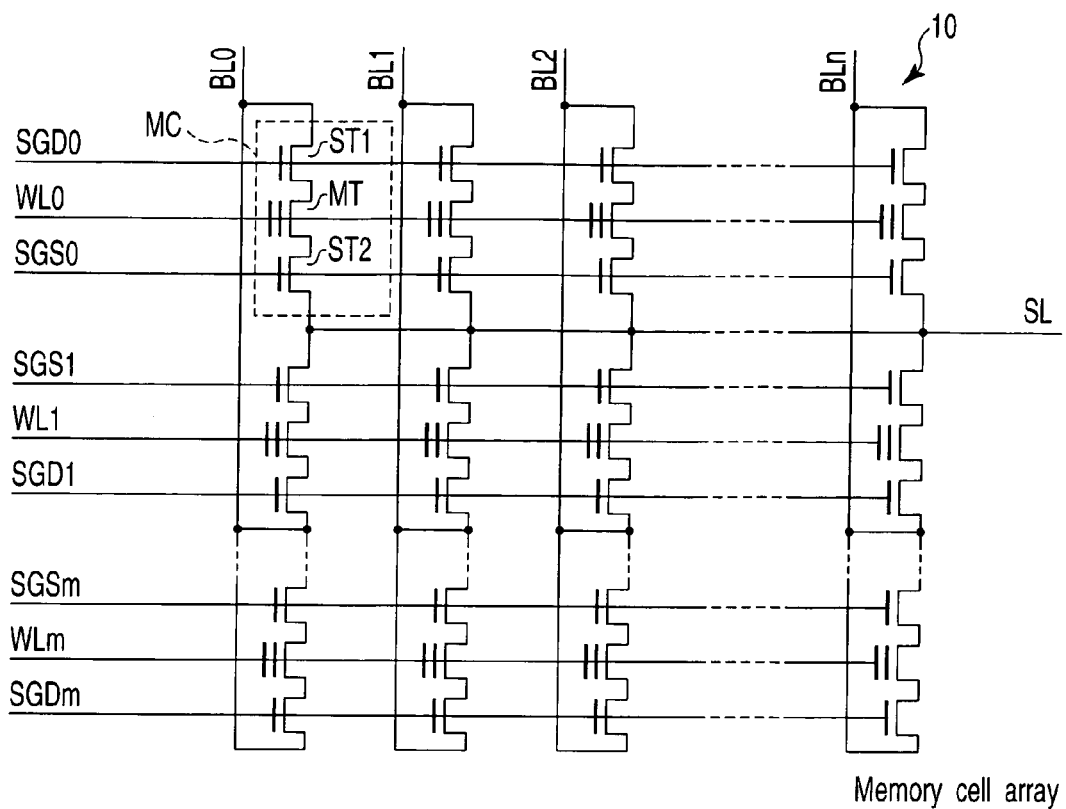
FIG. 27 is a circuit diagram of a memory cell array provided in a flash memory in accordance with a fourth embodiment of the present invention.

Now, description will be given of a semiconductor memory device according to a fourth embodiment of the present invention. The present embodiment corresponds to the first and second embodiments that use a 3Tr-NAND type flash memory in place of the 2Tr flash memory. FIG. 27 is a circuit diagram of the memory cell array included in the 3Tr-NAND type flash memory. Since the structure is the same as first embodiment, except the configuration of the memory cell array, its explanation will be omitted.

As shown in the figure, the memory cell array 10 comprises ((m+1)×(n+1)) memory cells MC arranged in a matrix. Each of the memory cells has a memory cell transistor MT and select transistors ST1 and ST2 which have respective current paths connected in series. The current path in the memory cell transistor MT is connected between the current paths in the select transistors ST1 and ST2. The memory cell transistor MT comprises a stacked gate structure having a floating gate formed on the semiconductor substrate with a gate insulating film interposed therebetween and a control gate formed on the floating gate with an inter-gate insulating film interposed therebetween. Each of the select transistors ST1 and ST2 also has a multilayer gate structure including a first polycrystalline silicon layer formed on the semiconductor substrate with a gate insulating film interposed therebetween and a second polycrystalline silicon layer formed on the first polycrystalline silicon layer with a inter-gate insulating film interposed therebetween. The source region of the select transistor ST1 is connected to the drain region of the memory cell transistor MT. The source region of the memory cell transistor MT is connected to the drain region of the select transistor ST2. Further, the memory cells arranged adjacent to each other across the columns share the drain region of the select transistor ST1 or the source region of the select transistor ST2.

Each of the word lines WL0 to WLm connects commonly the control gates of the memory cell transistors MT in the same row. Each of the select gate lines SGD0 to SGDm connects commonly the gates of the select transistors ST1 in the same row. Each of the select gate lines SGS0 to SGSm connects commonly the gates of the select transistors ST2 in the same row. Each of the bit lines BL0 to BLn connects commonly the drain regions of the select transistors ST1 in the same column. The source line SL connects commonly the source regions of the select transistors ST2.

The first and second embodiments are applicable even to the above 3Tr-NAND type flash memory.

Figure 28:
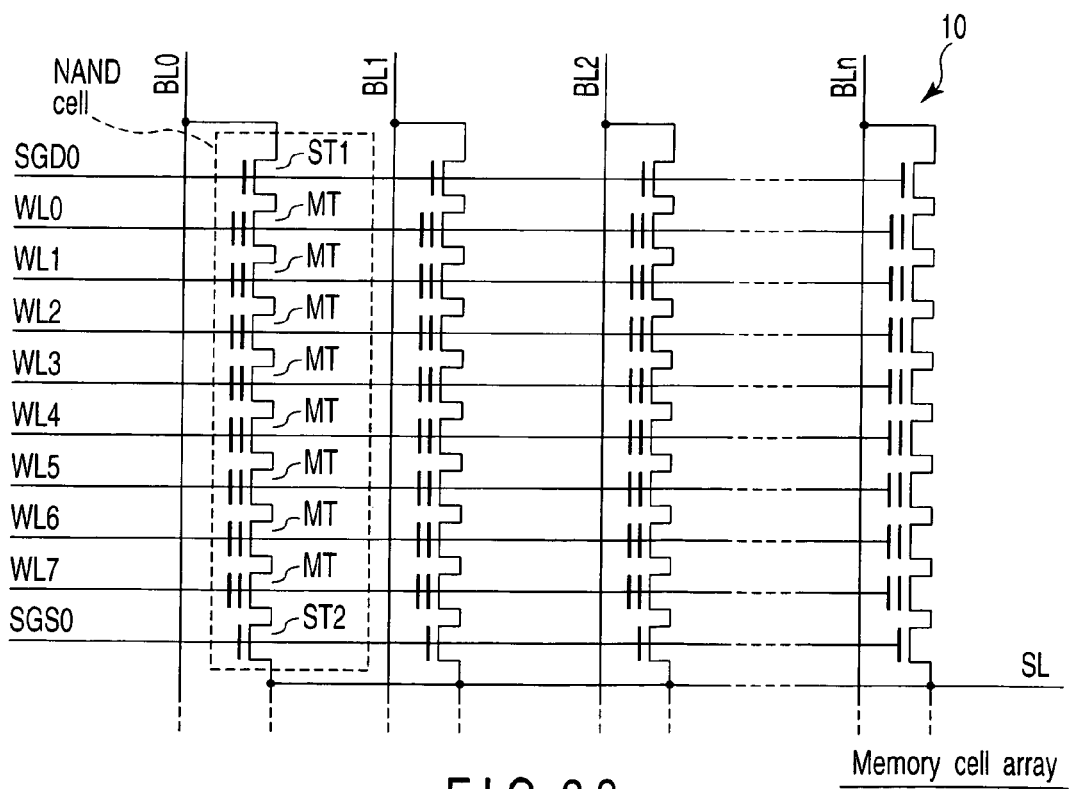
FIG. 28 is a circuit diagram of a memory cell array provided in a flash memory in accordance with a fifth embodiment of the present invention.

Now, description will be given of a semiconductor memory device according to a fifth embodiment of the present invention. The present embodiment corresponds to the first and second embodiments that use a NAND type flash memory in place of the 2Tr flash memory. FIG. 28 is a circuit diagram of a memory cell array provided in the NAND type flash memory. Since the structure is the same as first embodiment, except the configuration of the memory cell array, its explanation will be omitted.

As shown in the figure, the memory cell array 10 comprises a plurality of NAND cells arranged in a matrix. Each of the NAND cells includes eight memory cell transistors MT and select transistors ST1 and ST2. The memory cell transistor MT comprises a stacked gate structure having a floating gate formed on the semiconductor substrate with a gate insulating film interposed therebetween and a control gate formed on the floating gate with an inter-gate insulating film interposed therebetween. The number of memory cell transistors MT is not limited to eight but may be 16 or 32. The number of memory cell transistor MT is not limited. The adjacent memory cell transistors MT share a source and a drain. Each memory cell transistor MT is placed between the select transistors ST1 and ST2 so that their current paths are connected in series. One end of the memory cell transistor MT, that is, its drain region, is connected to the source region of the select transistor ST1; the memory cell transistor MT is connected in series with the select transistors ST1 and ST2. The other end of the memory cell transistor MT, that is, its source region, is connected to the drain region of the select transistor ST2. That is, the NAND cell corresponds to the memory cell in the 3Tr-NAND type flash memory which has a plurality of memory cell transistors MT.

Each of the word lines WL0 to WLm connects commonly the control gates of the memory cell transistors MT in the same row. The select gate lines SGD and SGS connect commonly the gates of the select transistors ST1 and ST2, respectively, in the same row. The word lines WL0 to WLm and select gate lines SGS and SGD are connected to the row decoder. Further, each of the bit lines BL0 to BLn connects commonly the drain of the select transistors ST1 in the same column in the memory cell array. The sources of the select transistors ST2 are connected to the source line SL. Both the select transistors ST1 and ST2 are not required. Only one of the select transistors ST1 and ST2 may be provided if any of the NAND cells can be selected.

The first and second embodiments are applicable even to the above NAND type flash memory.

Figure 29:
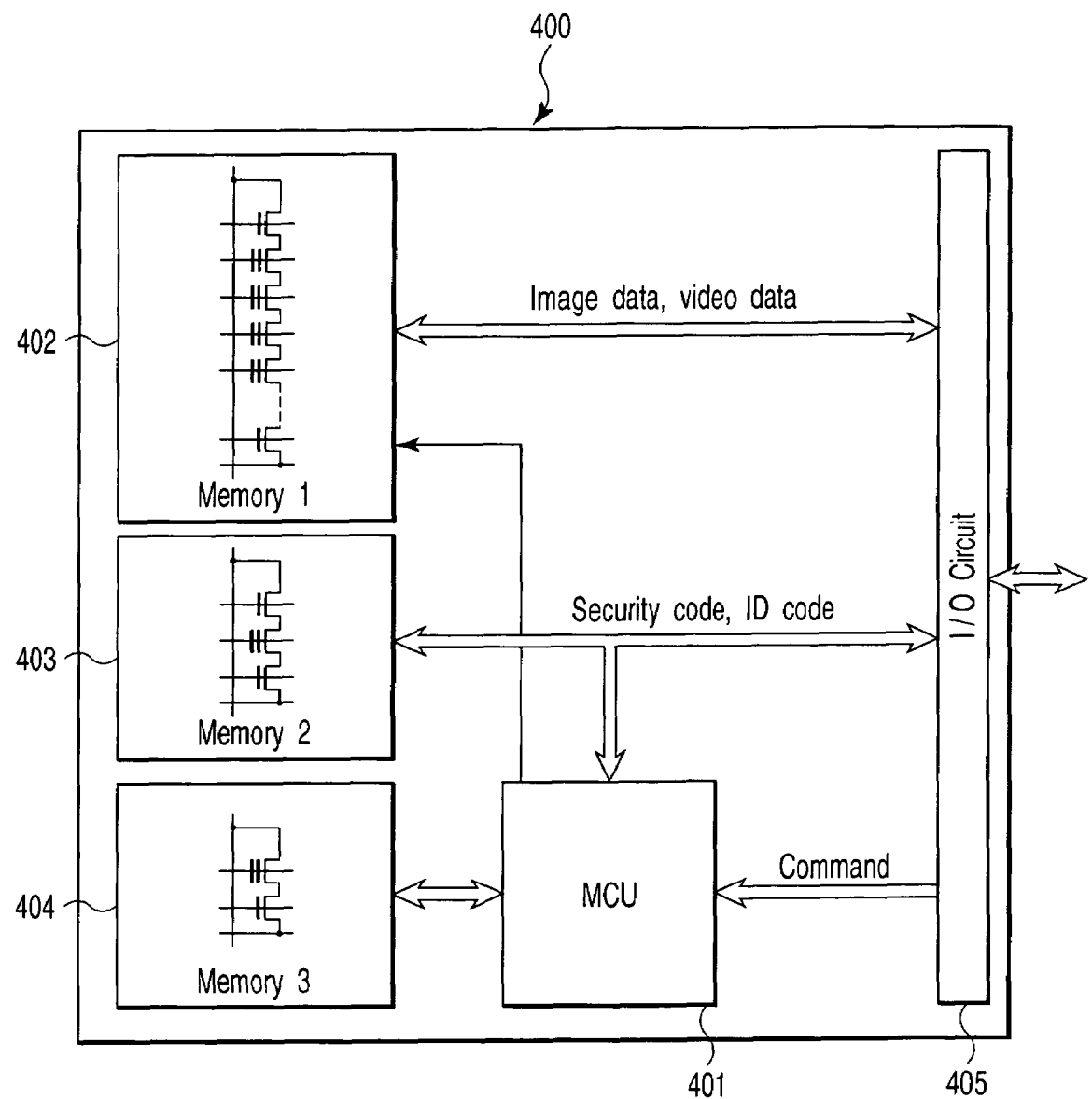
FIG. 29 is a block diagram of LSI in accordance with a sixth embodiment of the present invention.

Now, description will be given of a semiconductor memory device according to a sixth embodiment of the present invention. The present embodiment relates to a system LSI in which the flash memories described in the first to fifth embodiments are embedded to the same chip. FIG. 29 is a block diagram of the system LSI according to the present embodiment.

As shown in the figure, a system LSI 400 comprises MCU 401, an I/O circuit 405, and a NAND type flash memory 402, a 3Tr-NAND type flash memory 403, and a 2Tr flash memory 404 formed on the same semiconductor substrate.

The NAND type flash memory 402 is used as a storage memory to which image and video data are saved. The configuration of the NAND type flash memory 402 is as described in the fifth embodiment.

The 3Tr-NAND type flash memory 403 retains an ID or security code required to access the LSI 400. The configuration of the 3Tr-NAND type flash memory 403 is as described in the fourth embodiment.

The 2Tr flash memory 404 retains program data required to operate MCU 401. The configuration of the 2Tr flash memory 404 is as described in the first to third embodiments.

In response to various externally input commands, MCU 401 executes processes based on programs read from the 2Tr flash memory. On this occasion, MCU 401 directly accesses the 2Tr flash memory 404 without using SRAM (Static Random Access Memory) or the like. Examples of processes executed by MCU 401 include compression and decompression of data input to the NAND type flash memory 404 and control of an external device. Moreover, if the data held in the NAND type flash memory 402 is externally accessed, MCU 401 reads predetermined data from the 3Tr-NAND type flash memory 403. MCU 401 then checks the read data against an externally input ID or security code. If the data matches the ID or security code, MCU 401 permits an access to the NAND type flash memory 402. When the access to the NAND type flash memory 402 is permitted, the data in the NAND type flash memory 402 is externally accessed (by a host). That is, in response to an externally received command, MCU 401 triggers the NAND type flash memory 402 to read (write) data.

The I/O circuit 405 controls the transmission of signals between LSI 400 and an external device.

For the system LSI 400, configured as described above, it is possible to form, during the same step, the memory cell transistors MT and select transistors ST1, ST2, and ST provided in the NAND type flash memory 402, 3Tr-NAND type flash memory 403, and 2Tr flash memory 404. That is, the MOS transistors are formed by the same oxidation step, deposition step, impurity injection step, and photolithography etching step. As a result, the three flash memories 402 to 404 have the same gate insulating films, the same intergate insulating films, the same floating and control gates of the memory cell transistors MT, and the same select gates of the select transistors. This manufacturing method enables the memory cell arrays in the three flash memories to be formed using a number of steps required to form one flash memory.

The 2Tr flash memory 404 uses a positive voltage and a negative voltage for the read and erase operations. The MOS transistor used for the row decoder provided in the 2Tr flash memory 404 may have a thinner gate insulating film than the MOS transistor used for the row decoder provided in the NAND type flash memory 402 or 3Tr-NAND type flash memory 403. This makes it possible to reduce the size of the row decoder in the 2Tr flash memory, while increasing its operation speed.

The 2Tr flash memory 404 retains program data required to operate MCU 401. As described above, the 2Tr flash memory 404 operates at high speed. Accordingly, MCU 401 can read data directly from the 2Tr flash memory 404 without using RAM or the like. This eliminates the need for RAM or the like, thus simplifying the configuration of the system LSI. The operation speed can also be increased.

The 3Tr-NAND type flash memory 403 retains the ID or security code. The code data does not have a large data volume but is frequently changed or updated. Accordingly, the memory retaining the code data must operate somewhat fast. In this regard, the 3Tr-NAND type flash memory 403 uses a smaller erase unit than the NAND type flash memory 402. The 3Tr-NAND type flash memory 403 enables data to be rewritten page by page. Therefore, the 3Tr-NAND type flash memory 403 is an optimum semiconductor memory for retaining the code data.

An LSI with a NAND type flash memory conventionally requires such a controller as described below in order to prevent a rewrite operation from concentrating on particular blocks. The controller converts an input address into a physical address and performs control such that if any block is defective, this block will no longer be used. However, the present embodiment does not require such a controller. This is because the 2Tr flash memory 404 may retain a firmware program that controls the blocks in the NAND type flash memory 402 so that MCU 401 can perform the above control. MCU 401 may perform this control in the intervals between operations that must intrinsically be performed by it (control of an external device and calculation of data input to the NAND type flash memory). Of course, if the amount of processing that must intrinsically be executed by MCU 401 is large compared to the level of capabilities of MCU 401, a hardware sequencer or the like may be provided to control the NAND flash memory 402.

As described above, the adverse effect of coupling noise can be reduced by the semiconductor memory device in accordance with any of the first to sixth embodiments of the present invention. This function is provided by the regulators 100 and 110 in the configuration in accordance with the first embodiment. The regulators 100 and 111 control the output voltages VP and VN from the charge pumps 80 and 90, respectively, to predetermined voltage levels. The regulators 100 and 110 then output the voltages VPCP and VNCP, respectively. The regulators 100 and 110 perform control such that, for example, the value Vref' obtained by dividing the voltage VPCP or VNCP by the resistance is equal to the reference voltage Vref. During a voltage reset operation associated with a test, the regulators 100 and 110 provide currents larger than those normally supplied. That is, the output impedance is reduced below the normal value. This makes the voltages VPCP and VNCP unlikely to undergo coupling noise.

Further, in the second embodiment, the voltage detectors 140 and 150 are provided in place of the regulators 100 and 110. The voltage regulators 140 and 150 monitor the voltages VPCP and VNCP, respectively, to control the operations of the charge pumps 80 and 90, respectively, so that the voltages VPCP and VNCP are set at predetermined values. The voltage detectors 140 and 150 perform control such that, for example, the value Vref' obtained by dividing the voltage VPCP or VNCP by the resistance is equal to the reference voltage Vref. During a voltage reset operation associated with a test, the regulators 140 and 150 provide currents larger than those normally supplied. That is, the output impedance is reduced below the normal value. This makes the voltages VPCP and VNCP unlikely to undergo coupling noise.

Therefore, even if data is simultaneously written into a plurality of pages, the situation is avoided in which one of the voltages is affected by coupling caused by resetting of the other voltage. This enables a quick reset operation.

In the description of the first embodiment, the flash memory 3 comprises both the positive voltage regulator 100 and the negative voltage regulator 110. However, if, for example, the negative voltage is reset earlier and the voltage level of the negative voltage can be controlled, the negative voltage regulator 110 is unwanted, with only the positive voltage regulator 100 required. Conversely, if the positive voltage is reset earlier and the voltage level of the positive voltage can be controlled, the positive voltage regulator 100 is unwanted, with only the negative voltage regulator 110 required. This is because a node that has been reset and stabilized at 0V (or Vcc2) is unlikely to suffer the adverse effect of coupling noise. Therefore, both the regulators 100 and 110 may be provided but it is unnecessary to make variable the output impedance of the regulator that regulates the voltage reset earlier.

Further, in the description of the first and second embodiments, either the negative or positive voltage is reset. However, the negative and positive voltages may be simultaneously reset. Even in this case, the negative and positive voltages are reset without undergoing the adverse effect of coupling noise. Moreover, in the description of the above embodiments, the example of the area affected by the coupling noise is the part between the control gate and the well region. However, the description also applies to the part between the select gate line and the control gate or drain region, the part between the control gate and the drain region, or the part between other wires.

Furthermore, the first and second embodiments are particularly effective on the 2Tr flash memory. This is because the 2Tr flash memory uses a negative and positive voltages for a write or erase operation. That is, immediately after a write or erase operation, neither a high- nor low-voltage-side node is at 0V. Accordingly, varying the voltage of one of the nodes makes the other node likely to be affected. Therefore, the first and second embodiments are particularly effective on general semiconductor memories in which data can be written into a large number of memory cells by FN tunneling and which use a negative and positive voltages for a write and erase operations.

Moreover, in the first and second embodiments, the reset operation is defined as a change from the positive voltage VPP or negative voltage VBB to the read voltage (0V or Vcc2). However, the voltage value need not necessarily be set equal to the read voltage but may be appropriately set in accordance with specifications for the memory. Alternatively, the first and second embodiments may be combined. For example, the positive voltage may be controlled by the positive voltage regulator 110, whereas the negative voltage may be detected by the negative voltage detector.

Further, in the description of the first and second embodiments, the output impedances of the regulators 100 and 110 and detectors 140 and 150 vary depending on the number of write bits. However, the output impedances may vary depending on an erase unit. Specifically, to reset the voltage after an erase operation associated with a test has been finished, the output impedances of the regulators 100 and 110 and detectors 140 and 150 may be set lower than those measured during a normal operation. This is because data may be erased from more bits at a time during a test operation than during a normal erase operation. As in the case of a write operation, the parasitic capacitance naturally increases consistently with the number of bits from which data is erased at a time. Therefore, also for an erase operation, the application of the above embodiments enables effects similar to those of the above embodiments to be exerted. In this case, operations for an erase process are exactly the same as those for a write process except that the positiveness and negativeness of the voltages are reversed.

Next, an application of the flash memory will be explained. FIG. 30 shows an example of a memory card. As shown in FIG. 30, the memory card 900 includes a flash memory 3 (2Tr flash memory and 3Tr-NAND flash memory or NAND flash memory) explained in the above embodiments. The flash memory 3 receives specific controls signals and data from an external unit (not shown). In addition, the flash memory 3 outputs specific control signals and data to the external unit.

A signal line (DAT), a command line enable signal line (CLE), an address line enable signal line (ALE) and a ready/busy signal line (R/B) are connected to the memory card 900 having the flash memory 3. The signal line (DAT) transfers data, address or command signals. The command line enable signal line (CLE) transfers a signal, which indicates that a command signal is transferred on the signal line (DAT). The address line enable signal line (ALE) transfers a signal, which indicates that an address signal is transferred on the signal line (DAT). The ready/busy signal line (R/B) transfers a signal, which indicates whether the memory device is ready, or not.

Another exemplary implementation is shown in FIG. 31. The memory card shown in FIG. 31 differs from the memory card presented in FIG. 30 in that the memory card of FIG. 31 includes, in addition to the memory device, a controller 910 which controls the flash memory 3 and receives/transfers predetermined signals from/to an external device (not shown).

The controller 910 includes interface units (I/F) 911, 912, a microprocessor unit (MPU) 913, a buffer RAM 914 and an error correction code unit (ECC) 915. The interface units (I/F) 911, 912 receives/outputs predetermined signals from/to an external device (not shown). The microprocessor unit 913 converts a logical address into a physical address. The buffer RAM 914 stores data temporarily. The error correction code unit 915 generates an error correction code. A command signal line (CMD), a clock signal line (CLK) and a signal line (DAT) are connected to the memory card 900. It should be noted that the number of the control signal lines, bit width of the signal line (DAT) and a circuit construction of the controller could be modified suitably.

Figure 32:
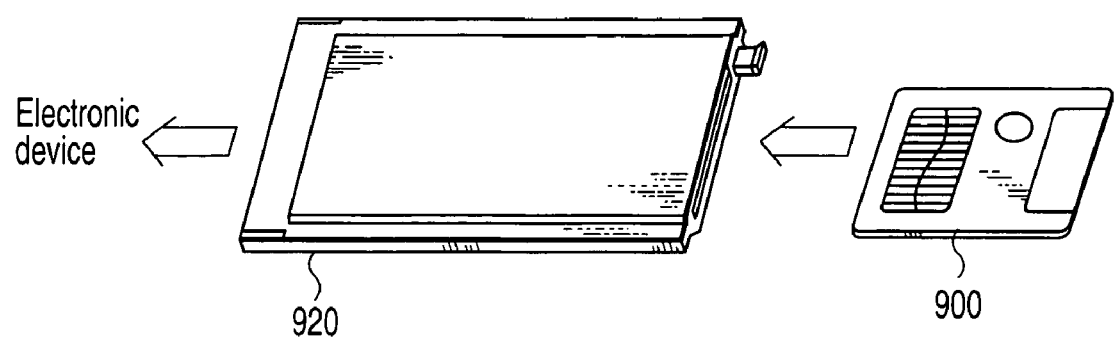
FIG. 32 is a diagram showing the appearance of the memory card and a card holder comprising the flash memory in accordance with any of the first to fifth embodiments of the present invention.

FIG. 32 shows another application. As shown in FIG. 32, the memory card 900 is inserted into a cardholder 920, which is then connected to electronic equipment (not shown). The cardholder 920 may have a part of the function of the controller 910.

Figure 33:
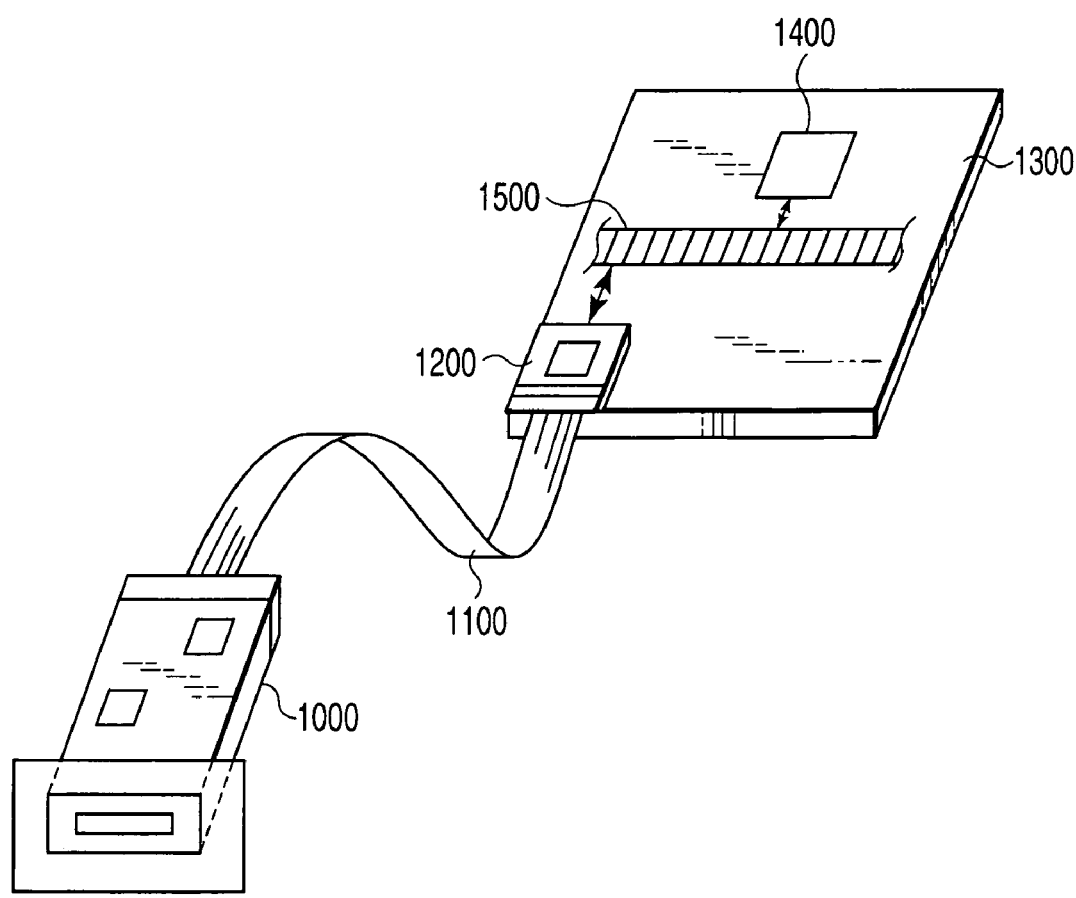
FIG. 33 is a diagram showing the appearance of a connector used to connect the memory card comprising the flash memory in accordance with any of the first to fifth embodiments of the present invention.

FIG. 33 shows another application. As shown in FIG. 33, the memory card 900 or the cardholder 920 in which the memory card 900 has been inserted is inserted into a connection unit 1000. The connection unit 1000 is connected to a board 1300 via a connection cable 1100 and an interface circuit 1200. The board 1300 includes a CPU 1400 and a bus 1500.

Figure 34:
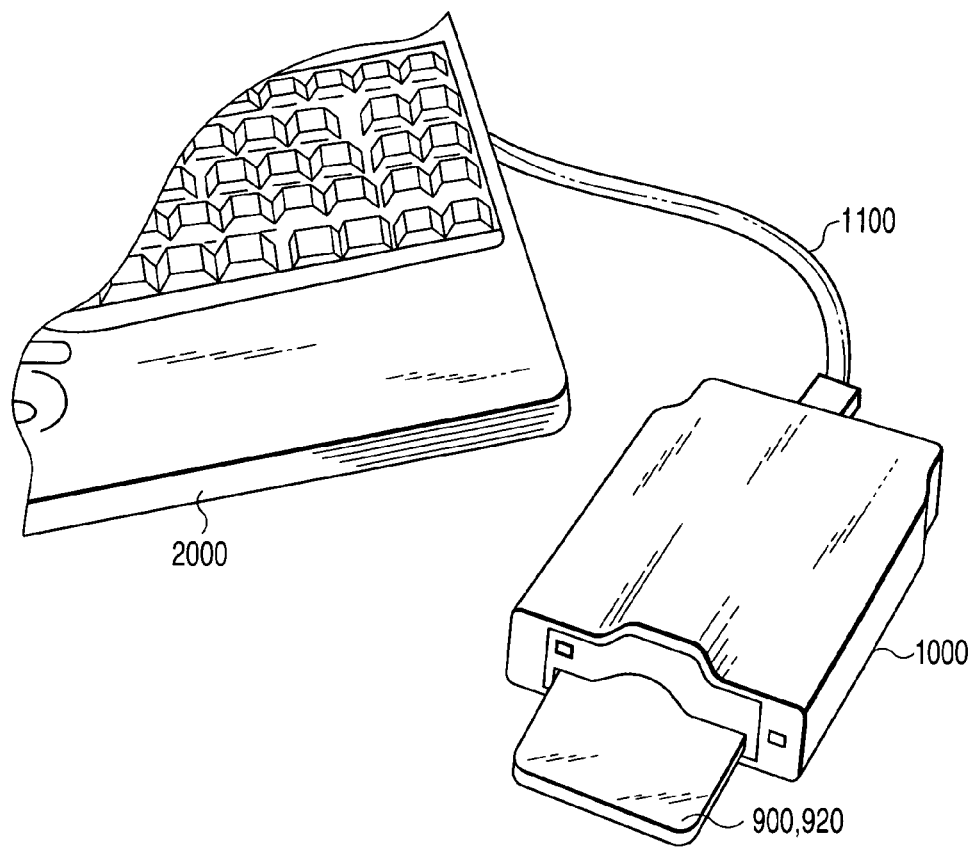
FIG. 34 is a diagram showing the appearance of a connector used to connect the memory card comprising the flash memory in accordance with any of the first to fifth embodiments of the present invention.

FIG. 34 shows another application. The memory card 900 or the cardholder 920 in which the memory card 900 has been inserted is inserted into the connection unit 1000. The connection unit 1000 is connected to a personal computer 2000 via the connection cable 1100.

Figure 35:
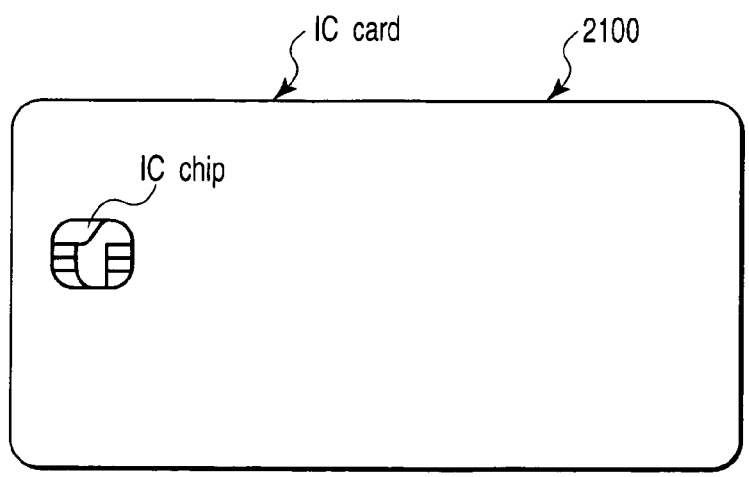
FIG. 35 is a diagram showing the appearance of an IC card comprising the flash memory in accordance with any of the first to fifth embodiments of the present invention.
Figure 36:
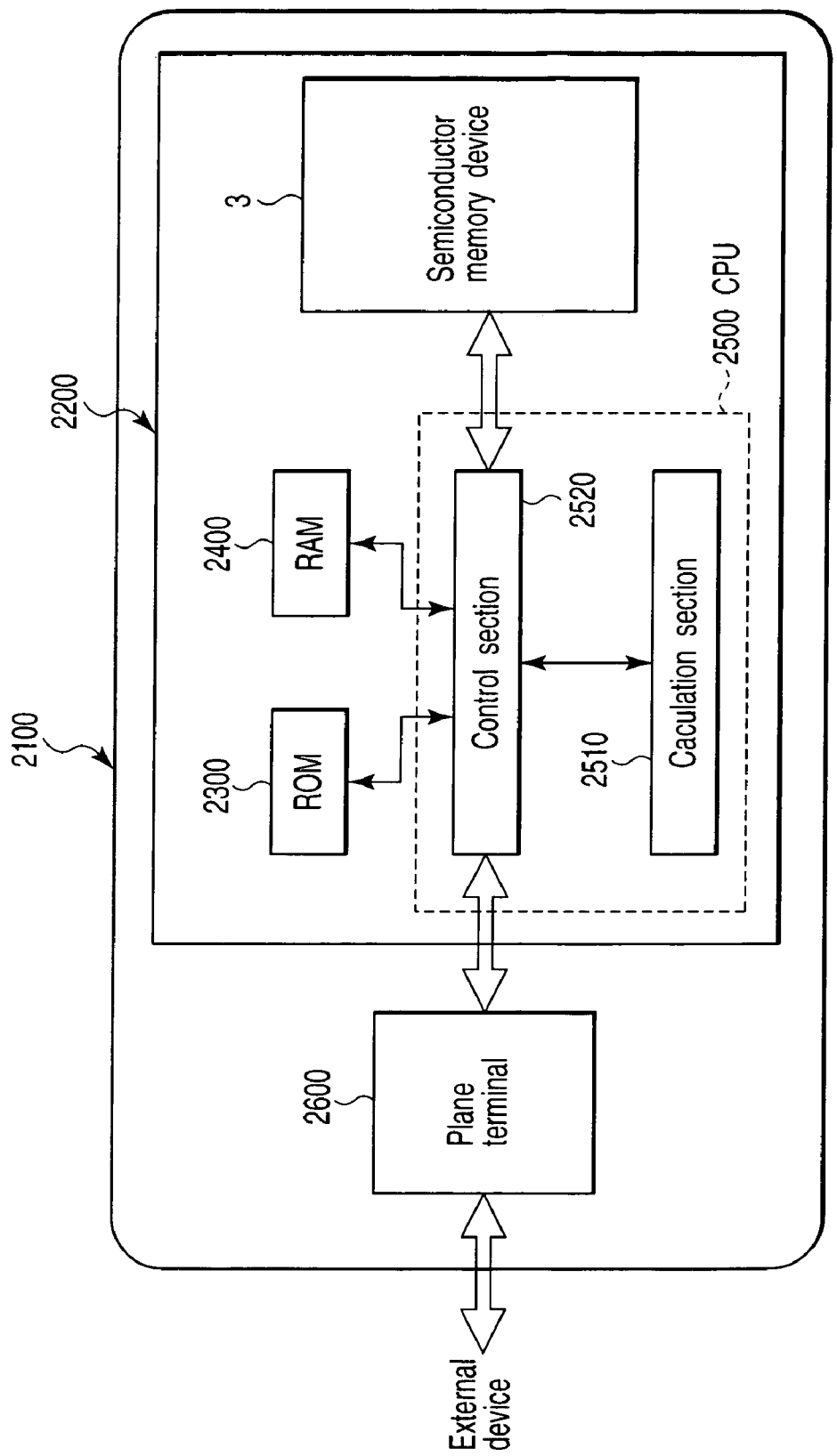
FIG. 36 is a block diagram showing the IC card comprising the flash memory in accordance with any of the first to fifth embodiments of the present invention.

FIGS. 35 and 36 show another application. As shown in FIGS. 35 and 36, an IC card 2100 includes an MCU 2200. The MCU 2200 includes the flash memory 10 according to any one of the above embodiments, other circuits, including ROM 2300 and RAM 2400, and a CPU 2500. The IC card 2100 is connectable to the MCU 2200 via a plane connecting terminal 2600 connected to the MCU 2200 and provided on the IC card 2100. The CPU 2500 includes a computing section 2510 and a control section 2520 connected to the flash memory 3, ROM 2300, and RAM 2400. For example, the MPU 2200 is provided on one side of the IC card 2100 and the plane connecting terminal 2600 is provided on the other side.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a plurality of memory cells each including a first MOS transistor comprising a floating gate and a control gate formed on the floating gate;
   a memory cell array comprising a plurality of the memory cells arranged in a matrix;
   a first voltage generating circuit which generates a first positive voltage;
   a reference voltage generating circuit which generates a first reference voltage; and
   a first voltage control circuit which sets the first positive voltage generated by the first voltage generating circuit at a voltage value based on the first reference voltage and which outputs a resulting second positive voltage, an output impedance of the first voltage control circuit varying depending on the number of bits into which data is simultaneously written, the second positive voltage being used to write and erase data into and from the memory cells.

2. The device according to claim 1, further comprising:
   a second voltage generating circuit which generates a first negative voltage;
   a second voltage control circuit which sets the first negative voltage generated by the second voltage generating circuit at a voltage value based on a second reference voltage generated by the reference voltage generating circuit and which outputs a resulting second negative voltage; and
   word lines each of which connects commonly the control gates of the first MOS transistors in the memory cells on the same row,
   wherein the second negative voltage is used to write and erase data into and from the memory cells,
   in a first operation mode, the data is simultaneously written into the memory cells connected to one of the word lines,
   in a second operation mode, the data is simultaneously written into the memory cells connected to all the word lines,
   after the data is written into the memory cells in the second operation mode, a value for the output impedance of the first voltage control circuit during a reset operation is smaller than those obtained during other periods, and
   in the reset operation, the second negative voltage is set to a voltage value used to read the data.

3. The device according to claim 2, wherein the first voltage control circuit includes a current path reaching a node to which a power supply voltage is applied from a node to which the second positive voltage is applied, and the current path is newly activated for the reset operation.

4. The device according to claim 2, wherein to write the data, the second positive voltage is applied to the word line, and the second negative voltage is applied to a semiconductor substrate on which the memory cells are formed.

5. The device according to claim 1, further comprising:
   a second voltage generating circuit which generates a first negative voltage;
   a second voltage control circuit which sets the first negative voltage generated by the second voltage generating circuit at a voltage value based on a second reference voltage generated by the reference voltage generating circuit and which outputs a resulting second negative voltage,
   wherein the output impedance of the second voltage control circuit varies depending on the number of memory cells into which data is simultaneously written, and
   the second negative voltage is used to write and erase the data into and from the memory cells.

6. The device according to claim 5, further comprising:
   word lines each of which connects commonly the control gates of the first MOS transistors in the memory cells on the same row,
   wherein in a first operation mode, the data is simultaneously written into the memory cells connected to one of the word lines,
   in a second operation mode, the data is simultaneously written into the memory cells connected to all the word lines,
   after the data is written into the memory cells in the second operation mode, a value for the output impedance of the second voltage control circuit during a reset operation is smaller than those obtained during other periods, and in the reset operation, the second negative voltage is set to a voltage value used to read the data.

7. The device according to claim 6, wherein the second voltage control circuit includes a current path reaching a node to which a power supply voltage is applied from a node to which the second negative voltage is applied, and the current path is newly activated for the reset operation.

8. The device according to claim 1, wherein each of the memory cells further includes a second MOS transistor having a drain connected to a source of the first MOS transistor, the device further includes:
bit lines each of which connects commonly drains of the first MOS transistors in the memory cells on the same row in the memory cell array; and
source lines each of which connects sources of the second MOS transistors together.

9. A semiconductor memory device comprising:
a plurality of memory cells each including a first MOS transistor comprising a floating gate and a control gate formed on the floating gate;
a memory cell array comprising a plurality of the memory cells arranged in a matrix;
a first voltage generating circuit which generates a positive voltage;
a reference voltage generating circuit which generates a first reference voltage; and
a first voltage detecting circuit which compares a first detection level with the first reference voltage and which controls the first voltage generating circuit on the basis of a comparison result between the first detection level and the first reference voltage, the first detection level being a predetermined rate of a voltage value of the positive voltage, the first detection level and an output impedance of the first voltage detecting circuit varying depending on the number of bits into which data is simultaneously written, the positive voltage being used to write and erase data into and from the memory cells.

10. The device according to claim 9, further comprising:
a second voltage generating circuit which generates a negative voltage;
a second voltage detecting circuit which compares a second detection level with a second reference voltage generated by the reference voltage generating circuit and which controls the second voltage generating circuit on the basis of a comparison result between the second detection level and the second reference voltage, the second detection level being a predetermined rate of a voltage value of the negative voltage; and
word lines each of which connects commonly the control gates of the first MOS transistors in the memory cells on the same row,
wherein the negative voltage is used to write and erase data into and from the memory cells,
in a first operation mode, the data is simultaneously written into the memory cells connected to one of the word lines,
in a second operation mode, the data is simultaneously written into the memory cells connected to all the word lines, and
after the data is written into the memory cells in the second operation mode, a value for the output impedance of the first voltage detecting circuit during a reset operation is smaller than those obtained during other periods, and in the reset operation, a voltage value of a node to which the negative voltage has been applied is set to a value used to read the data.

11. The device according to claim 10, wherein the first voltage detecting circuit includes a current path reaching a node to which a power supply voltage is applied from a node to which the positive voltage is applied, and the current path is newly activated for the reset operation.

12. The device according to claim 10, wherein to write the data, the positive voltage is applied to the word line, and the negative voltage is applied to a semiconductor substrate on which the memory cells are formed.

13. The device according to claim 9, further comprising:
a second voltage generating circuit which generates a negative voltage; and
a second voltage detecting circuit which compares a second detection level with a second reference voltage generated by the reference voltage generating circuit and which controls the second voltage generating circuit on the basis of a comparison result between the second detection level and the second reference voltage, the second detection level being a predetermined rate of a voltage value of the negative voltage,
wherein the second detection level and the output impedance of the second voltage detecting circuit vary depending on the number of memory cells into which data is simultaneously written, and
the negative voltage is used to write and erase the data into and from the memory cells.

14. The device according to claim 13, further comprising:
word lines each of which connects commonly the control gates of the first MOS transistors in the memory cells on the same row,
wherein in a first operation mode, the data is simultaneously written into the memory cells connected to one of the word lines,
in a second operation mode, the data is simultaneously written into the memory cells connected to all the word lines,
after the data is written into the memory cells in the second operation mode, a value for the output impedance of the second voltage detecting circuit during a reset operation is smaller than those obtained during other periods, and
in the reset operation, the voltage value of a node to which the positive voltage has been applied is set to a value used to read the data.

15. The device according to claim 14, wherein the second voltage control circuit includes a current path reaching a node to which a power supply voltage is applied from a node to which the negative voltage is applied, and the current path is newly activated for the reset operation.

16. The device according to claim 9, wherein each of the memory cells further includes a second MOS transistor having a drain connected to a source of the first MOS transistor, the device further includes:
bit lines each of which connects commonly drains of the first MOS transistors in the memory cells on the same row in the memory cell array; and
source lines each of which connects commonly sources of the second MOS transistors.

17. A method of controlling a semiconductor memory device comprising:

writing data into memory cells connected to a plurality of word lines simultaneously, using a positive voltage and a negative voltage;

after writing the data, reducing an output impedance of a first voltage generating circuit which generates the positive voltage;

with the output impedance of the first voltage generating circuit reduced, setting a node to which the negative voltage has been applied at a first read potential used to read the data; and after the node is set at the first read potential, setting a node to which the positive voltage has been applied at a second read potential used to read the data.

18. A memory card comprising a semiconductor memory device recited in claim 1.

19. The card according to claim 18, further comprising a control unit which controls the semiconductor memory device.

* * * * *